United States Patent
Painter

(10) Patent No.: US 9,719,168 B2
(45) Date of Patent: Aug. 1, 2017

(54) GYROSCOPE AND DEVICES WITH STRUCTURAL COMPONENTS COMPRISING HFO2-TIO2 MATERIAL

(71) Applicant: Chris Painter, Dublin, CA (US)

(72) Inventor: Chris Painter, Dublin, CA (US)

(73) Assignee: BEI SENSORS & SYSTEMS COMPANY, INC., Moorpark, CA (US)

( * ) Notice: Subject to any disclaimer, the term of this patent is extended or adjusted under 35 U.S.C. 154(b) by 0 days.

(21) Appl. No.: 14/882,006

(22) Filed: Oct. 13, 2015

(65) Prior Publication Data

US 2016/0032449 A1 Feb. 4, 2016

Related U.S. Application Data

(62) Division of application No. 13/419,186, filed on Mar. 13, 2012, now Pat. No. 9,188,442.

(51) Int. Cl.
  *C23C 16/22* (2006.01)
  *G01C 19/5691* (2012.01)
  (Continued)

(52) U.S. Cl.
  CPC ............ *C23C 16/22* (2013.01); *C23C 16/405* (2013.01); *C23C 28/042* (2013.01); *C23C 28/42* (2013.01); *G01C 19/5691* (2013.01)

(58) Field of Classification Search
  CPC ....... C23C 16/405; C23C 16/22; C23C 28/42; C23C 28/042
  See application file for complete search history.

(56) References Cited

U.S. PATENT DOCUMENTS 3,657,063 A * 4/1972 Brown .................... C04B 35/14
  156/86
4,940,636 A * 7/1990 Brock ................. C03C 17/3411
  359/586

(Continued)

FOREIGN PATENT DOCUMENTS

EP    0300579 A2    1/1989
EP    1923667 A2    5/2008
(Continued)

OTHER PUBLICATIONS

Ruh, Robert et al., Phase Relations and Thermal Expansion in the System HfO2—TiO2, Journal of American Ceramic Society; Aug. 4, 1976, pp. 495-499, vol. 59, Illinois.
(Continued)

*Primary Examiner* — Kelly M Gambetta
(74) *Attorney, Agent, or Firm* — Banner & Witcoff, Ltd.

(57) ABSTRACT

Disclosed are devices, materials, systems, and methods, including a device that includes one or more structural components, at least one of the one or more structural components comprising substantially $HfO_2$—$TiO_2$ material. Also disclosed is a hemispherical resonator that includes a hemisphere including one or more structural components with at least one of the one or more structural components comprising substantially $HfO_2$—$TiO_2$ material, a forcer electrode configured to apply an electrical force on the hemisphere to cause the hemisphere to oscillate, and one or more sensor electrodes disposed in proximity to the hemisphere and configured to sense an orientation of a vibration pattern of the hemispherical resonator gyroscope.

9 Claims, 15 Drawing Sheets

(51) Int. Cl.
*C23C 16/40* (2006.01)
*C23C 28/04* (2006.01)
*C23C 28/00* (2006.01)

(56) References Cited

U.S. PATENT DOCUMENTS

| | | | |
|---|---|---|---|
| 4,951,508 | A | 8/1990 | Loper, Jr. et al. |
| 5,450,751 | A | 9/1995 | Putty et al. |
| 5,712,427 | A | 1/1998 | Matthews |
| 6,272,925 | B1 | 8/2001 | Watson |
| 6,640,630 | B1 | 11/2003 | de Salaberry |
| 7,155,978 | B2 | 1/2007 | Lo et al. |
| 7,318,347 | B2 | 1/2008 | Lynch et al. |
| 8,338,205 | B2 | 12/2012 | Huang |
| 2006/0270147 | A1* | 11/2006 | Ahn ............... C23C 16/405 438/240 |
| 2007/0119258 | A1 | 5/2007 | Yee |
| 2009/0031831 | A1* | 2/2009 | Stewart ............ G01C 19/5691 74/5.6 D |
| 2011/0239763 | A1 | 10/2011 | Shkel et al. |
| 2011/0290021 | A1 | 12/2011 | Horning et al. |
| 2012/0144917 | A1 | 6/2012 | Painter |
| 2013/0015437 | A1 | 1/2013 | Yamazaki |
| 2013/0037793 | A1 | 2/2013 | Pan et al. |
| 2013/0050290 | A1 | 2/2013 | Andersson et al. |
| 2013/0100065 | A1 | 4/2013 | Felnhofer et al. |
| 2013/0104653 | A1 | 5/2013 | Bernstein et al. |

FOREIGN PATENT DOCUMENTS

| | | |
|---|---|---|
| EP | 2390624 A2 | 11/2011 |
| GB | 2272053 | 5/1994 |
| JP | 360-166818 A | 8/1985 |
| JP | 2009-033148 A | 2/2009 |
| JP | 2009-272824 A | 11/2009 |
| JP | 2012-042452 A | 3/2012 |
| WO | 2009017623 A1 | 2/2009 |

OTHER PUBLICATIONS

Jun. 3, 2013—(WO) International Search Report and Written Opinion—App PCT/US2013/026836.
Feb. 21, 2014—(EP) Extended Search Report—App 11193233.1.
Skaggs, S.R., Zero and Low Coefficient of Thermal Expansion of Polycrystalline Oxides, Sep. 1977.
Duwel, Amy et al., Experimental Study of Termoelastic Damping in MEMS Gyros, Sensors and Actuators A 103 (2003 pp. 70-75.
Sneh, Ofer, Strategies for High-Productivity ALED, Solid State technology, vol. 46, Issue 11, http://www.electroiq.com/content/eiq-2/en/articles/sst/print/volume-46/issue-11/departments/feol/strategies-for-high-productivity-ald.html, no date.
Sundew Technologies, LLC, Broomfield, CO, Revolution system product line description, available at www.sundewtech.com/download/Revolution_datasheet.pdf, no date.

* cited by examiner

Electrode $HfO_2$ $TiO_2$

Codeposited $HfO_2$-$TiO_2$ combination

Substrate

GYROSCOPE AND DEVICES WITH STRUCTURAL COMPONENTS COMPRISING HFO2-TIO2 MATERIAL

This application is a divisional of, and claims priority to, co-pending U.S. application Ser. No. 13/419,186, filed Mar. 13, 2012, which is incorporated by reference in its entirety herein.

STATEMENT REGARDING FEDERALLY SPONSORED RESEARCH OR DEVELOPMENT

The invention described herein was made with Government support in the performance of work under contract HR0011-11-C-0046 awarded by DARPA. The Government has certain rights in the invention.

BACKGROUND

Hemispherical resonator gyroscopes are high performing vibratory rotation sensors. The hemispherical resonator gyroscope may measure rotation rates or rotation angles through rotational-vibrational coupling (e.g., Coriolis coupling) between structural modes of the gyroscope. One of the modes, designated the drive mode, is initially made to oscillate at high levels of velocity. Rotation induced Coriolis force then couples motion from the first mode into a secondary structural mode with a magnitude proportional to the magnitude of the input rotation. Commonly used vibrational modes used in hemispherical resonator gyroscopes are the two cos 2θ modes, named for their mode shape.

The ring down time is a figure of merit of hemispherical resonator gyroscopes and is commonly designated by the symbol τ. The ring down time may be considered to be the amplitude decay constant of the hemispherical resonator of the gyroscope if all external forces are removed and the hemisphere is allowed to freely oscillate. The ring down time may also quantify the amount of effort required to maintain the oscillation pattern of the hemispherical resonator, where a hemispherical resonator with a larger ring down time requires less effort. The ring down time is generally dependent on to the equivalent mass (m) and damping coefficient (b) of the hemispherical resonator where $\tau = 2\,m/b$.

SUMMARY

Thus, in some variations, a device is disclosed. The device includes one or more structural components, at least one of the one or more structural components comprising substantially $HfO_2$—$TiO_2$ material.

Embodiments of the device may include at least some of the features described in the present disclosure, including one or more of the following features.

The at least one of the one or more structural components may include a portion comprising entirely $HfO_2$—$TiO_2$ material such that the portion independently provides structural integrity to the at least one of the one or more structural components.

The at least one of the one or more structural components may include at least one structural component comprising substantially the $HfO_2$—$TiO_2$ material with one of, for example, an amorphous glass-based structure, and/or a polycrystalline-based structure.

The at least one of the one or more structural components comprising substantially the $HfO_2$—$TiO_2$ material may include at least one structural component comprising substantially a $HfO_2$—$TiO_2$ material with near-zero thermal expansion.

The $HfO_2$—$TiO_2$ material may include $63HfO_2$-$37TiO_2$ material.

The at least one of the one or more structural components may include a hemispherical shell of a hemispherical resonator gyroscope. The hemispherical resonator gyroscope may have a ring down time, representative of amplitude decay when the hemispherical resonator gyroscope is allowed to freely oscillate, of at least 100 seconds.

The at least one of the one or more structural components comprising substantially the $HfO_2$—$TiO_2$ material may further include a conductive electrode placed within the at least one of the one or more structural components so that opposite surfaces of the electrode each contact respective at least one layer of the $HfO_2$—$TiO_2$ material.

In some embodiments, a method is disclosed. The method includes depositing one or more layers of $HfO_2$ material and one or more layers of $TiO_2$ material, and using the deposited one or more $HfO_2$ layers and the deposited one or more $TiO_2$ layers to produce a structural component of a device, the structural component comprising substantially the deposited one or more layers of the $HfO_2$ material and the deposited one or more layers of the $TiO_2$ material.

Embodiments of the method may include at least some of the features described in the present disclosure, including at least some of the features described above in relation to the device, as well as one or more of the following features.

The produced structural component of the device may be adapted to independently provide structural integrity of the structural component.

Depositing the one or more layers of the $HfO_2$ material and the one or more layers of the $TiO_2$ material may include alternatingly depositing the one or more layers of the $HfO_2$ material and the one or more layers of the $TiO_2$ material such that each of the one or more $TiO_2$ layers is deposited adjacent to at least one of the one or more $HfO_2$ layers and is separated from any other of the one or more $TiO_2$ layers by one of the one or more $HfO_2$ layers.

Depositing the one or more layers of the $HfO_2$ material and the one or more layers of the $TiO_2$ material may include co-depositing the one or more layers of the $HfO_2$ material and the one or more layers of the $TiO_2$ material.

The method may further include placing a conductive electrode within the structural component so that opposite surfaces of the electrode each contact respective at ones of the deposited one or more $HfO_2$ layers and the deposited one or more $TiO_2$ layers used to produce the structural component.

Placing the conductive electrode may include placing the electrode at, or close to, center of the structural component's thickness.

Using the deposited one or more $HfO_2$ layers and the deposited one or more $TiO_2$ layers to produce the structural component of the device may include using the deposited one or more $HfO_2$ layers and the deposited one or more $TiO_2$ layers to produce a hemispherical shell of a hemispherical resonator gyroscope.

Each of the deposited one or more $HfO_2$ layers and each of the deposited one or more $TiO_2$ layers may be associated with a corresponding predetermined thickness so that the structural component of the device comprises substantially $63HfO_2$-$37TiO_2$ material.

Depositing the one or more layers of the $HfO_2$ material and the one or more layers of the $TiO_2$ material may include depositing the one or more layers of $HfO_2$ material and the one or more layers of $TiO_2$ material through one or more of, for example, atomic layer deposition manufacturing procedure, and/or chemical vapor deposition manufacturing procedure.

In some embodiments, a hemispherical resonator gyroscope is disclosed. The hemispherical resonator gyroscope includes a hemisphere including one or more structural components with at least one of the one or more structural components comprising substantially $HfO_2$—$TiO_2$ material, a forcer electrode configured to apply an electrical force on the hemisphere to cause the hemisphere to oscillate, and one or more sensor electrodes disposed in proximity to the hemisphere and configured to sense an orientation of a vibration pattern of the hemispherical resonator gyroscope.

Embodiments of the hemispherical resonator gyroscope may include at least some of the features described in the present disclosure, including at least some of the features described above in relation to the device and the method, as well as one or more of the following features.

The at least one of the one or more structural components of the hemisphere comprising substantially the $HfO_2$—$TiO_2$ material may include a portion comprising entirely $HfO_2$—$TiO_2$ material such that the portion independently provides structural integrity to the at least one of the one or more structural components.

The at least one of the one or more components comprising substantially $HfO_2$—$TiO_2$ may include a hemispherical shell comprising substantially $HfO_2$—$TiO_2$ material.

The at least one of the one or more structural components of the hemisphere may comprise substantially $63HfO_2$-$37TiO_2$ material.

The hemisphere including the at least one of the one or more structural components comprising substantially the $HfO_2$—$TiO_2$ may result, at least in part, in a ring down time for the hemispherical resonator gyroscope, representative of amplitude decay when the hemispherical resonator gyroscope is allowed to freely oscillate without application of electrical force from the forcer electrode, of at least 100 seconds.

The at least one of the one or more components of the hemisphere may comprise substantially $HfO_2$—$TiO_2$ material with near-zero thermal expansion.

The at least one of the one or more structural components comprising substantially the $HfO_2$—$TiO_2$ material may further include a conductive electrode placed within the at least one of the one or more structural components so that opposite surfaces of the electrode each contact respective at least one layer of the $HfO_2$—$TiO_2$ material.

The one or more structural components may further include a plurality of masses positioned around a rim of the hemisphere.

Each of the plurality of masses may have a substantially identical weight.

The plurality of masses may have different weights, heavier masses may be positioned at points of maximum deflection of the hemispherical resonator, and lighter masses may be positioned between the points of maximum deflection.

In some embodiments, a method is disclosed. The method includes depositing one or more layers of a material to produce a hemispherical shell of a hemispherical resonator gyroscope, and placing a conductive electrode layer within the hemispherical shell so that opposite surfaces of the electrode layer each contact respective at least one of the one or more deposited layers of the material.

Embodiments of the method may include at least some of the features described in the present disclosure, including at least some of the features described above in relation to the device, the first method, and the hemispherical resonator gyroscope, as well as the following feature.

Depositing the one or more layers of the material may include depositing one or more layers of a $HfO_2$—$TiO_2$-based material.

The devices, systems, materials, methods and other implementations described herein enable improving the ring down time of a gyroscope by, for example, increasing the gyroscope's hemisphere's equivalent mass, m, and/or by decreasing the hemisphere's damping coefficient, b.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, is meant to encompass variations of ±20% or ±10%, ±5%, or +0.1% from the specified value, as such variations are appropriate to in the context of the systems, devices, sensors, circuits, methods, and other implementations described herein.

As used herein, including in the claims, "and" as used in a list of items prefaced by "at least one of" or "one or more of" indicates that any combination of the listed items may be used. For example, a list of "at least one of A, B, and C" includes any of the combinations A or B or C or AB or AC or BC and/or ABC (i.e., A and B and C). Furthermore, to the extent more than one occurrence or use of the items A, B, or C is possible, multiple uses of A, B, and/or C may form part of the contemplated combinations. For example, a list of "at least one of A, B, and C" may also include AA, AAB, AAA, BB, etc.

Other and further objects, features, aspects, and advantages of the present disclosure will become better understood with the following detailed description of the accompanying drawings.

BRIEF DESCRIPTION OF THE DRAWINGS

FIGS. 2A-I are diagrams of stages in the manufacture/fabrication of an arbitrary component/member of a device.

Like reference symbols in the various drawings indicate like elements.

DETAILED DESCRIPTION

Figure 1:
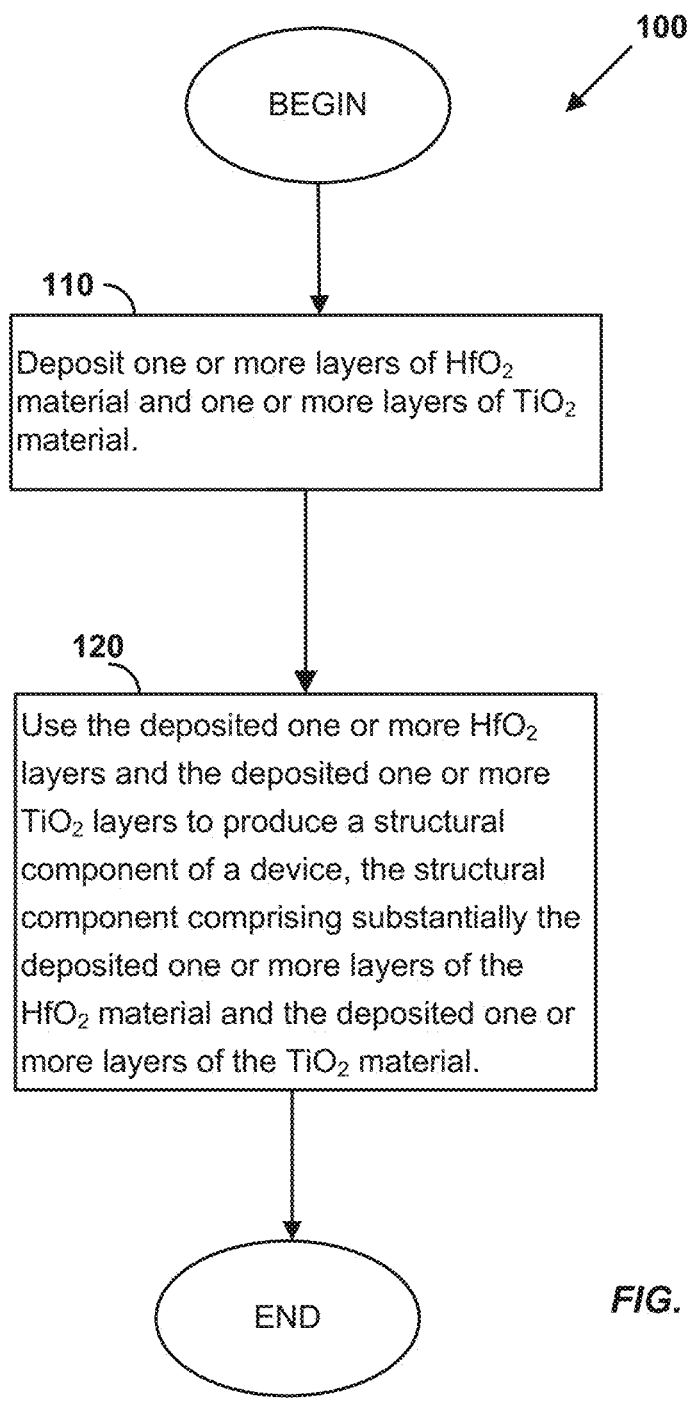
FIG. 1 is a flowchart of an example general procedure to produce/manufacture a component/member of a device.

Disclosed herein are systems, devices, sensors, methods, and other implementations, including a device including one or more structural components, with at least one of the one or more structural components (e.g., a hemisphere component of a hemispherical resonator gyroscope) comprising substantially $HfO_2$—$TiO_2$ material (Hafnium-Oxide/Titanium-Oxide material). Thus, in some variations, the at least one of the one or more structural components of such a device includes a portion comprising exclusively $HfO_2$—$TiO_2$ adapted to independently provide structural integrity of the at least one of the one or more structural components. For example, where the particular component comprising substantially a $HfO_2$—$TiO_2$ material is the hemisphere of a hemispherical resonator gyroscope, the $HfO_2$—$TiO_2$ hemisphere can maintain its shape/form without breaking or without having its structural properties degrade during multiple cycles of use (e.g., to use of the hemisphere to measure rotation mechanical rotation).

In some implementations, a method for producing structural components of a device is also provided. Such a method may include depositing one or more layers of $HfO_2$ material and one or more layers of $TiO_2$ material, and using the deposited one or more $HfO_2$ layers and the deposited one or more $TiO_2$ layers to produce a structural component of a device, the structural component comprising substantially the deposited one or more layers of the $HfO_2$ material and the deposited one or more layers of the $TiO_2$ material. In some variations, the depositing of the $HfO_2$ layers and the $TiO_2$ layers may be implemented using, for example, sequential depositing, in which the $HfO_2$ layers and $TiO_2$ layers are alternatingly deposited. In some variations, the depositing of the $HfO_2$ layers and $TiO_2$ layers may be implemented using co-depositing procedures.

One way to improve the performance of a hemispherical resonator gyroscope ("HRG"), e.g., to increase the HRG's ring down time, is by decreasing the damping coefficient b (in accordance with the relationship $\tau = 2$ m/b). Generally, there are a number of damping sources operating on a device or system, including damping sources that can be corrected by proper mechanical and package design. Another damping source is one related to achievable dissipation levels of the material constituting the device/system. This damping source is known as thermoelastic damping (TED), where the quality factor ($Q_{TED}$) for a structure can be expressed as:

$$Q_{TED} = \frac{C_V \cdot \rho}{E \cdot \alpha^2 \cdot T_0} \cdot \frac{1 + (\omega \cdot \tau_Z)^2}{\omega \cdot \tau_Z} \quad (1)$$

where $\omega$ is the resonant frequency, $\tau_Z$ is a time constant defined by the resonator geometry, E is Young's modulus, $C_V$ is heat capacity, $T_0$ is temperature, $\rho$ is density, and $\alpha$ is the material's thermal expansion factor. The damping constant is inversely proportional to the quality factor $$b = \frac{m \cdot \omega}{Q_{TED}} \quad (2)$$

Thus a material with a low thermal expansion will have low damping.

One material determined to have a low thermal expansion is the material combination $63HfO_2$-$37TiO_2$. One use of this material is to coat other materials and structures. As will be described in greater details below, this material, and other materials based on various other combinations of $HfO_2$ and $TiO_2$ can be used as structural materials that independently provide a device's components/members substantially comprising such material combinations with structural integrity. In other words, members/components manufactured primarily or substantially from material combinations of $HfO_2$ and $TiO_2$ can maintain their structural form and/or shape through multiple uses of the components/members without breaking or undergoing significant degradation in their performance during such multiple uses. An $HfO_2$—$TiO_2$ material that independently provides structural integrity to a particular component/member substantially comprising the $HfO_2$—$TiO_2$ material can do so without needing to rely on another piece/portion (comprising a material other than a $HfO_2$—$TiO_2$-based material) to provide or enable the structural integrity of the particular component/member (e.g., the $HfO_2$—$TiO_2$ portion may have sufficient structural rigidity to independently provide the component's/member's structural integrity). In some variations, components and members comprising substantially material combination of $HfO_2$ and $TiO_2$ can be produced through, for example, various deposition procedures/techniques. For example, vapor phase deposition may be used to deposit sequential oxide layers to realize complex oxide metrologies. Also, atomic layer deposition (ALD), where single atomic layers are deposited in each fabrication pass, may also be used. With ALD-based techniques/procedures, thick structural layers capable of being used as mechanical gyroscope materials can be realized in short periods of time (e.g., within hours).

In some variations, components/members comprising substantially material combination(s) of $HfO_2$ and $TiO_2$ include components/members in which: a) the portion/percentage of the $HfO_2$—$TiO_2$-based material in a particular component/member is at least 50% of the weight of the particular component/member, b) the portion/percentage by weight of the $HfO_2$—$TiO_2$-portion in a particular component/member relative to any other material constituting the particular component/member is the highest (even if the portion/percentage of the $HfO_2$—$TiO_2$-based material relative to the overall weight of the component/member is less than 50%), or c) the physical dimensions of a portion of the component/member that is made from the $HfO_2$—$TiO_2$-based material is larger than the corresponding physical dimensions of any other part of the component/member not made from a $HfO_2$—$TiO_2$-based material (e.g., the thickness of the part of the component/member made from the $HfO_2$—$TiO_2$-based material is larger than the corresponding thickness of any other part of the component/member not made from a $HfO_2$—$TiO_2$-based material).

In some variations, a particular component/member comprising substantially $HfO_2$—$TiO_2$ material may include an $HfO_2$—$TiO_2$-based piece with one of, for example, an amorphous glass-based structure, and/or a polycrystalline-based structure. An amorphous form of the material is one where the HfO$_2$—TiO$_2$ material contains no crystal structure and the atoms are unordered. The amorphous structure can be achieved, for example, through lower temperature deposition of the material. A polycrystalline form of the material is one where the HfO$_2$—TiO$_2$ material is composed of many crystallites of, in some implementations, varying sizes and orientations, and the atoms are more ordered compared to an amorphous structure. A polycrystalline form of the material may be achieved through, for example higher temperature deposition of the material and/or high temperature thermal conditioning of an amorphous structure. As described herein, an advantage of a material based on HfO$_2$—TiO$_2$ combination is that such a material has a low thermal expansion which may be, in some variations, a near-zero thermal expansion. For example, in some variations, the material's thermal expansion coefficient may be between approximately $-0.5 \times 10^{-6}/°$ C. and $0.5 \times 10^{-6}/°$ C. In some variations, a material's thermal expansion attributes may be defined through the behavior/characteristics of the particular component/member produced from the HfO$_2$—TiO$_2$ combination substantially comprising the component/member. For example, where a hemisphere of a hemispherical resonator gyroscope is manufactured using, primarily, a HfO$_2$—TiO$_2$ material combination, the thermal expansion characteristics may be defined or expressed based on the ring down time associated with the hemisphere. Thus, low (e.g., "near-zero") thermal expansion for a HfO$_2$—TiO$_2$ combination material used to fabricate a hemisphere of a hemispherical resonator gyroscope may be deemed to be achieved when the hemisphere's ring down time, representative of amplitude decay when the hemispherical resonator gyroscope is allowed to freely oscillate, is of a certain value (e.g., at least 100 seconds, at least 500 seconds, etc.).

In some variations, a HfO$_2$—TiO$_2$ material combination used may be, for example, a 63HfO$_2$-37TiO$_2$ material combination, whose thermal expansion coefficient may be, for example, between approximately $-0.5 \times 10^{-6}/°$ C. and $0.5 \times 10^{-6}/°$ C. This combination of HfO$_2$—TiO$_2$, or other combinations with varying other proportions of HfO$_2$ and TiO$_2$ may be realized by controlling, for example, the weight of the separate HfO$_2$ and TiO$_2$ constituents that are added to form the particular material, by controlling the thickness of the separate HfO$_2$ and TiO$_2$ constituents that are added during manufacturing of a particular component/member (e.g., controlling the thickness of separate HfO$_2$ and TiO$_2$ layers deposited during a manufacturing process of a component/member based on a particular HfO$_2$ and TiO$_2$ material combination), etc.

With reference now to FIG. 1, a flowchart of an example general procedure 100 to produce/manufacture a component/member of a device (which may be any type of device, instrument, apparatus, etc.) is shown. The procedure 100 is further illustrated with reference to FIGS. 2A-I, showing stages in the formation of an arbitrary component/member. The procedure 100 includes depositing 110 one or more layers of hafnium oxide (HfO$_2$) material and one or more layers of titanium oxide (TiO$_2$) material. The deposited one or more HfO$_2$ layers and the deposited one or more TiO$_2$ layers are used 120 to produce a structural component of a device, with the structural component comprising substantially the deposited one or more layers of the HfO$_2$ material and the deposited one or more layers of the TiO$_2$ material.

Figure 2A:
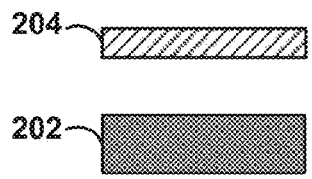
Figure 2E:
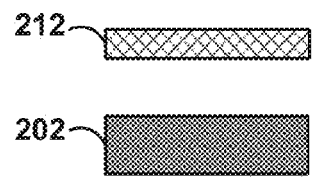
Figure 2B:
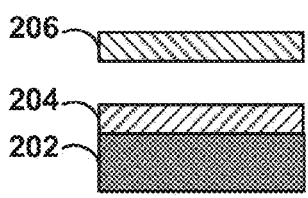
Figure 2F:
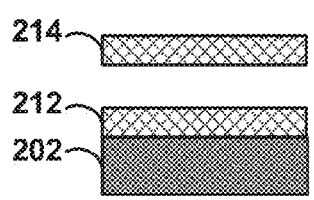
Figure 2C:
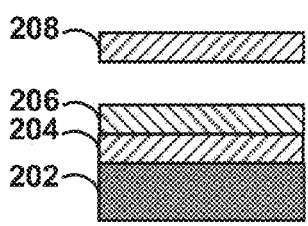
Figure 2G:
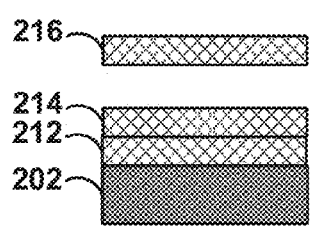

Particularly, as depicted, for example, in FIGS. 2A and 2E, the deposition of a HfO$_2$ and TiO$_2$ material combination may be performed by depositing layers of HfO$_2$ and TiO$_2$ materials, through such deposition techniques as, for example, atomic layer deposition (ALD) manufacturing procedure, chemical vapor deposition (CVD) manufacturing procedure, etc., on a substrate or mold 202 that forms the basis on which the component/member substantially comprising the HfO$_2$ and TiO$_2$ combination is produced. The substrate and/or mold may be shaped and configured to define the shape/configuration that the resultant component/member substantially comprising the HfO$_2$ and TiO$_2$ material combination will have. In some implementations, the substrate may be formed using an oxidized layer of silicon (e.g., SiO$_2$), on which a sacrificial a poly-Si layer (that can subsequently be removed to free the resultant fabricated HfO$_2$—TiO$_2$-based piece from the substrate/mold) is deposited. In the example of FIGS. 2A-H, the example substrate 202 used is a rectangular plate (shown in a front view perspective only), and thus the formed component/member will have, at least initially a plate-like configuration or shape (further processing may be performed during the post-depositing manufacturing process to further fashion the piece comprising substantially the deposited HfO$_2$ and TiO$_2$ material combination).

Figure 2D:
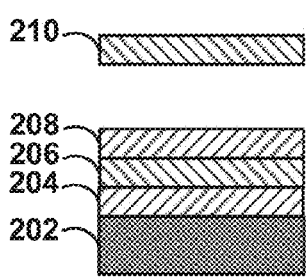

In some variations, depositing the one or more layers of the HfO$_2$ material and the one or more layers of the TiO$_2$ material may include alternatingly depositing the one or more layers of the HfO$_2$ material and the one or more layers of the TiO$_2$ material such that each of the one or more TiO$_2$ layers is deposited adjacent to at least one of the one or more HfO$_2$ layers and is separated from any other of the one or more TiO$_2$ layers by one of the one or more HfO$_2$ layers. Thus, in the example of FIG. 2A-2D, individual layers of TiO$_2$ and HfO$_2$ are shown deposited. Particularly, in this example, a TiO$_2$ layer 204 is deposited first on the substrate 202 (see FIG. 2A). A HfO$_2$ layer 206 is deposited on the layer 204 (FIG. 2B), followed by another TiO$_2$ layer 208 layer deposited on the layer 206 (FIG. 2C), and a HfO$_2$ layer 210 deposited on the layer 208 (FIG. 2D). This sequential deposition of individual TiO$_2$ and HfO$_2$ layer can continue until the aggregation of individually deposited layers reaches some pre-determined thickness.

In some variations, depositing the one or more layers of the HfO$_2$ material and the one or more layers of the TiO$_2$ material may include codepositing the one or more layers of the HfO$_2$ material and the one or more layers of the TiO$_2$ material. For example, the HfO$_2$ material and the TiO$_2$ material may simultaneously, or near-simultaneously, be deposited on the substrate 202 as layer 212 (as shown in FIG. 2E), or on earlier formed layers of the HfO$_2$—TiO$_2$ material combination (layers 212, 214, 216, and 218 depicted in FIG. 2F-H), where such earlier formed layers may have been deposited using sequential deposition procedures, codeposition procedures, or some other procedures.

Figure 2I:
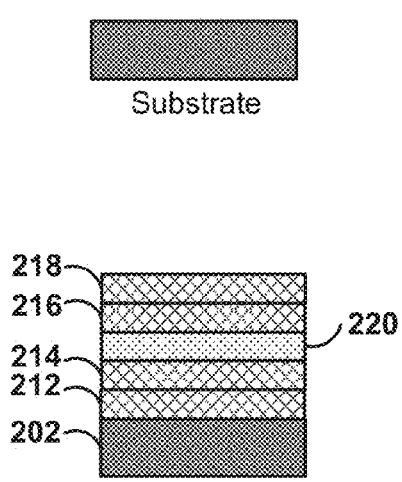

In some variations, fabrication of a structural component using HfO$_2$—TiO$_2$-based materials may include placing a conductive electrode layer (e.g., a metallic electrode) within the structural component so that opposite surfaces of the electrode each contact respective at least one of the deposited one or more HfO$_2$ layers and the deposited one or more TiO$_2$ layers used to produce the structural component. In some variations, placing the conductive electrode includes placing the electrode at, or close to, center of the structural component's thickness. For example, as depicted in FIG. 2I, a metallic (conductive) electrode 220 may be placed (e.g., through a depositing process or some other suitable placement process) on the HfO$_2$—TiO$_2$ layer 214. Subsequent to the placement of the electrode 220, additional HfO$_2$—TiO$_2$ layers are deposited on the electrode 220 (e.g., on the surface opposite the surface that was placed on the layer 214 in the example of FIG. 21). Thus, as shown in FIG. 21, layers 216 and 218 are placed on the electrode 220. In implementation where the structural component fabricated is a hemispherical shell of hemispherical resonator, an electrode placed within that structure may be used to enable applying a bias voltage (e.g., a DC bias voltage) so as to enable driving the hemispherical resonator.

As noted, in some variations, the structural component comprising substantially material combination(s) of $HfO_2$ and $TiO_2$ may be one in which the portion/percentage of the $HfO_2$—$TiO_2$-based material is at least 50% of the weight of the resultant structural component produced, the portion/percentage by weight of the $HfO_2$—$TiO_2$-based material in the resultant structural component, relative to any other material constituting the structural component is the highest, and/or the physical dimensions of the portion of the resultant structural component made from the $HfO_2$—$TiO_2$-based material is larger than the corresponding physical dimensions of any other part of the structural component not made from a $HfO_2$—$TiO_2$-based material (e.g., the thickness of the part of the component made from the $HfO_2$—$TiO_2$-based material is larger than the corresponding thickness of any other part of the component not made from a $HfO_2$—$TiO_2$-based material). The produced resultant structural component comprising substantially $HfO_2$—$TiO_2$-based material may be adapted to independently provide structural integrity of the structural component, e.g., the resultant structural component includes a portion constructed entirely (or exclusively or nearly exclusively) from a $HfO_2$—$TiO_2$-based material that independently provides the resultant structural component with structural integrity.

In some implementations, the particular $HfO_2$—$TiO_2$ combination that is to be formed may be achieved by controlling the thickness of the deposited $HfO_2$ and $TiO_2$ layers. For example, the thickness of the $HfO_2$ and $TiO_2$ layers deposited (be it through sequential deposition, codeposition, or some other process) may be controlled to achieve a structural component substantially comprising $63HfO_2$-$37TiO_2$ material. Other $HfO_2$—$TiO_2$ combinations at various proportions of $HfO_2$—$TiO_2$ may be formed and used.

As noted, one use of the $HfO_2$—$TiO_2$ material described herein is to produce (construct) at least a part of a hemispherical resonator gyroscope from this material. Because, as described herein, the ring down time of a hemispherical resonator gyroscope is dependent, at least in part, on to the equivalent mass and damping coefficient, b, of the hemispherical resonator (where $\tau=2$ m/b), the generally low thermal expansion characteristics of a $HfO_2$—$TiO_2$ material enable achieving a hemispherical resonator gyroscope device with improved ring down time performance. Thus, in some variations, a hemispherical resonator gyroscope is provided that includes a hemisphere having at least one of its structural components (e.g., a shell constituting the hemisphere) comprising substantially $HfO_2$—$TiO_2$ material. The at least one of the hemisphere's structural components independently provides structural integrity for such at least one structural component.

A hemispherical resonator gyroscope, with at least one of its structural components comprising substantially a $HfO_2$—$TiO_2$ material combination (e.g., such as $63HfO_2$-$37TiO_2$ material), may include a hemispherical resonator gyroscope such as the one described in U.S. application Ser. No. 12/966,700, entitled "Distributed Mass Hemispherical Resonator Gyroscope," and filed Dec. 13, 2010, the content of which is hereby incorporated by reference in its entirety.

Generally, in some variations, the hemispherical resonator gyroscope may be a micro-scale gyroscope (also referred to as a rotation sensor or vibration sensor with a hemispherical resonator) that includes a substrate with pickoff electrodes that are used to sense an azimuth orientation of a vibration pattern of a hemispherical resonator. A ring forcer electrode is configured to drive the hemispherical resonator. Voltage may be applied to the forcer electrode to control the amplitude of a standing wave associated with the resonator and to, for example, suppress unwanted quadrature effects. The pickoff electrodes, e.g., capacitor electrodes, may be used to determine the location and amplitude of the standing wave and additionally apply control forces to, for example, suppress unwanted quadrature effects. The capacitance of the pickoff electrodes may be modulated at the resonator flexing frequency. Capacitance changes in the pickoff electrodes may be used to determine rotation rates or rotation angles through rotational-vibrational coupling (e.g., Coriolis coupling) between structural modes of the gyroscope.

As will be described in greater details below, in some implementations, the ring down time performance of the resonator may be improved by increasing the device's equivalent mass. Mathematically, the equivalent mass of a hemispherical resonator gyroscope can be thought of as a series of point masses located at the points of maximum velocity or maximum deflection for the two mode shapes where the rest of the hemisphere is assumed to be massless. In a hemisphere, the equivalent mass is roughly equal to one third the total mass of the hemisphere. To increase the ring down time, $\tau$, the equivalent mass of the hemispherical resonator of the gyroscope may, in some variations, be made larger, for example, by increasing the hemisphere diameter. However, there are many applications that call for a fixed size hemisphere or a micro-scale gyroscope where increasing the size of the hemisphere is not feasible or practical. Thus, in some implementations, the equivalent mass of the hemispherical resonator may be increased by positioning masses around the periphery of the hemispherical resonator. For example, masses may be positioned around the periphery of the hemisphere outer rim. The masses may be made of a heavy metal such as tungsten, gold, platinum, lead, or any combination thereof. The masses may be positioned at points of maximum deflection or velocity of the resonator. For example, in a resonator using cos 2θ vibrational modes, eight masses may be distributed at approximately 45 degree increments around the periphery of the hemisphere outer rim. The shape of each mass may be symmetric about a radial vector going out to that mass. For example, circular, square, rectangular, or pie-shaped wedge masses may be used. The weights of the masses may be substantially identical (e.g., within manufacturing tolerances of 0-5%), and/or may depend on several factors, including, for example, expected damping levels and the desired ring down time, $\tau$. The weights of the individual masses may vary about the periphery of the hemisphere with heavier masses located at maximum points of deflection associated with the vibrational modes of the resonator. Lighter masses may be positioned between points of maximum deflection, preferably equally spaced around the periphery of the hemisphere. In some variations, the gyroscope (be it a micro-scale gyroscope or otherwise) may be implemented without positioning masses around the periphery of the hemispherical resonator. In such embodiments, achieving improved ring down time performance may be achieved, for example, by using a material, such as the $HfO_2$—$TiO_2$ materials described herein, with a low thermal expansion to construct/ provide at least one of the structural components of the hemispherical resonator, or any other component of the gyroscope.

Figure 3:
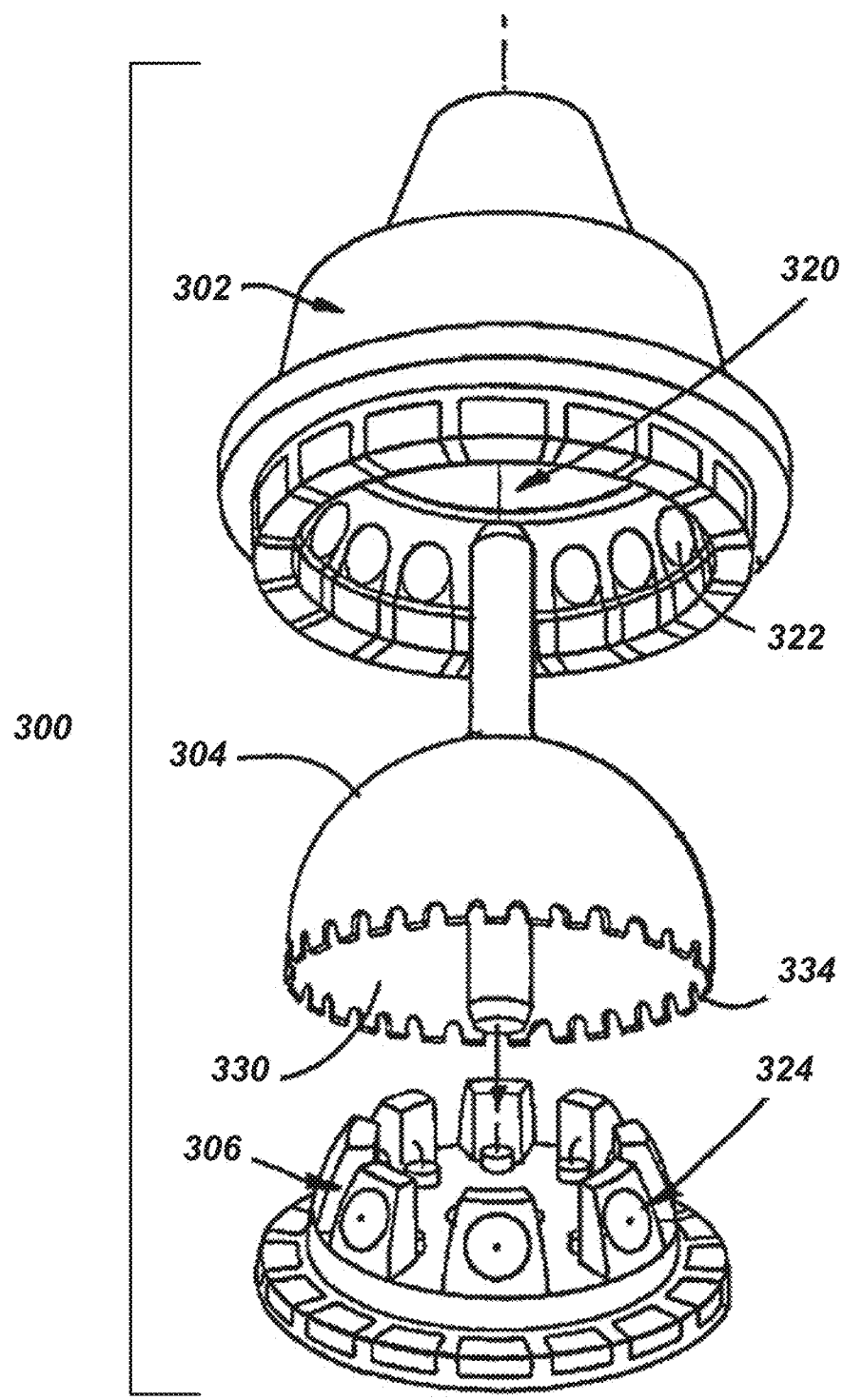
FIG. 3 is an exploded perspective view of a gyroscope.

Thus, with reference to FIG. 3, an exploded diagram of a hemispherical resonator gyroscope 300 is shown. The gyroscope 300 includes a housing 302, a hemispherical shell resonator 304, which may comprise substantially a $HfO_2$—$TiO_2$ material, and pickoff electrodes 306. The hemispherical shell resonator 304, comprising substantially the $HfO_2$—$TiO_2$ material, is adapted to independently provide structural integrity and to have the structural strength and robustness to rotate in the manner required to measure rotation undergone by the gyroscope 300 (e.g., without requiring another element, or material, to enable the shell to maintain its shape/form or to prevent breakage of the hemispherical shell resonator 304). The gyroscope 300 may also include a number of electrodes 322 that are metalized on the inside surface of the outer housing 302, which may be concentric with the hemispherical shell resonator 304. The electrodes 322 in the outer housing 302, together with a metalized electrode on the surface of hemispherical shell resonator 304, may form a series of forcing electrostatic capacitors. Voltage may be controllably/selectively applied to combinations of the electrodes 322 to control the amplitude of standing waves and to suppress unwanted quadrature effects.

Generally, the conductive layer (e.g., a metal layer) to facilitate electrostatic actuation is placed on the internal or external surfaces of the hemisphere. However, those surfaces experience stress during vibration, and the lossiness of the metal reduces ring down time. Thus, in some variations, an electrode may alternatively, or additionally, be deposited within the shell (e.g., deposited as part of the material deposition sequence described herein). Depositing the electrode within the shell, e.g., at a position close to the neutral bending axis where the bending stress is zero, reduces the damping losses of the metal. This, in turn, increases the ring down time compared to a hemisphere with a metal electrode on the exterior or interior hemisphere surfaces.

The gyroscope 300 may be rotated about an axis normal to the plane of a rim 334 of the hemispherical shell resonator 304. This rotation causes the standing wave to rotate in the opposite direction with respect to the gyroscope 300 by an angle proportional to the angle of rotation of gyroscope 300. Thus, by measuring the angle of rotation of the standing wave with respect to gyroscope 300, the angle of rotation of gyroscope 300 may be determined.

The vibrational mode of the hemispherical shell resonator 304 may be excited by placing a DC bias voltage on the resonator and an AC voltage on a forcing ring electrode 320. The frequency of the AC voltage may be, in some variations, twice the resonant frequency of the hemispherical shell resonator 304.

Signals from the gyroscope 300 contain information about the amplitude and location of the standing wave on the hemispherical shell resonator 304. These signals may be obtained capacitively. As noted, the pickoff electrodes 306 and 324 may be formed using a metalized interior surface 330 of hemispherical shell resonator 304 and may be located on an inner concentric housing held in close proximity to the inner metalized shell of the hemispherical shell resonator 304. As further noted, in some variations, an electrode(s) may be placed as a middle layer of the shell of the resonator 304. Because of the shell's oscillating deformation, the capacitance of each of the pickoff electrodes 306 and 324 may be modulated at the resonator flexing frequency. Electronic circuits, for example, may be used to measure these capacitance changes from which the location and amplitude of the standing wave(s) may be determined.

Figure 4:
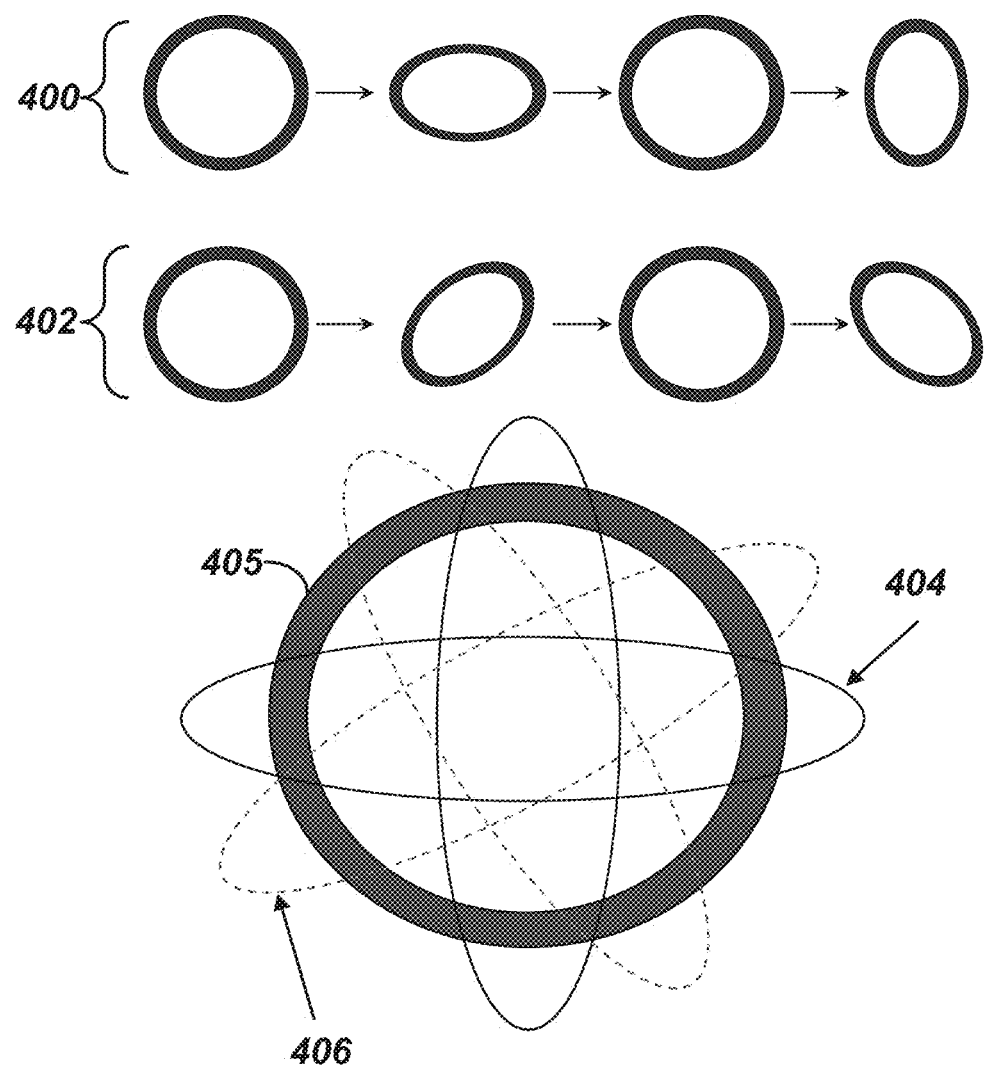
FIG. 4 shows illustrative oscillation modes of the gyroscope shown in FIG. 3.

FIG. 4 shows views of structural modes 400 and 402 from the hemisphere rim of gyroscope 300 of FIG. 3. Generally, the hemispherical resonator of a hemispherical resonator gyroscope has two structural modes that comprise the primary modes of operation of the gyroscope. The two structural modes may correspond to structural modes 400 and 402. The hemispherical resonator may be initially driven into a primary oscillation pattern as shown in structural mode 400. Rotation induced Coriolis force may cause precession of the primary oscillation pattern into structural mode 402. The precession may be proportional, for example, to the rate and angle of rotation. Initial vibratory oscillation pattern 404 and precessed oscillation pattern 406 corresponding to the structural modes 400 and 402 are shown overlaid on hemisphere rim 405.

As noted, the hemispherical resonator 304 of the gyroscope 300 depicted in FIG. 3 may comprise substantially a $HfO_2$—$TiO_2$ material (e.g., 63$HfO_2$-37$TiO_2$ material). In some implementations, construction/fabrication of the hemispherical shell may be performed using a procedure similar to the procedure described in relation to FIGS. 1 and 2. Thus, in such implementations, one or more layers of hafnium oxide ($HfO_2$) material and one or more layers of titanium oxide ($TiO_2$) material are deposited (e.g., by alternatingly depositing them, using various deposition processes/techniques, on each other and controlling the layers thickness to achieve the desired $HfO_2$—$TiO_2$ material, and/or by co-depositing the layers). The layers of $HfO_2$—$TiO_2$ material may be deposited on a substrate or mold configured to achieve the eventual desired form/shape of the structural component that is to be fabricated.

Figure 5:
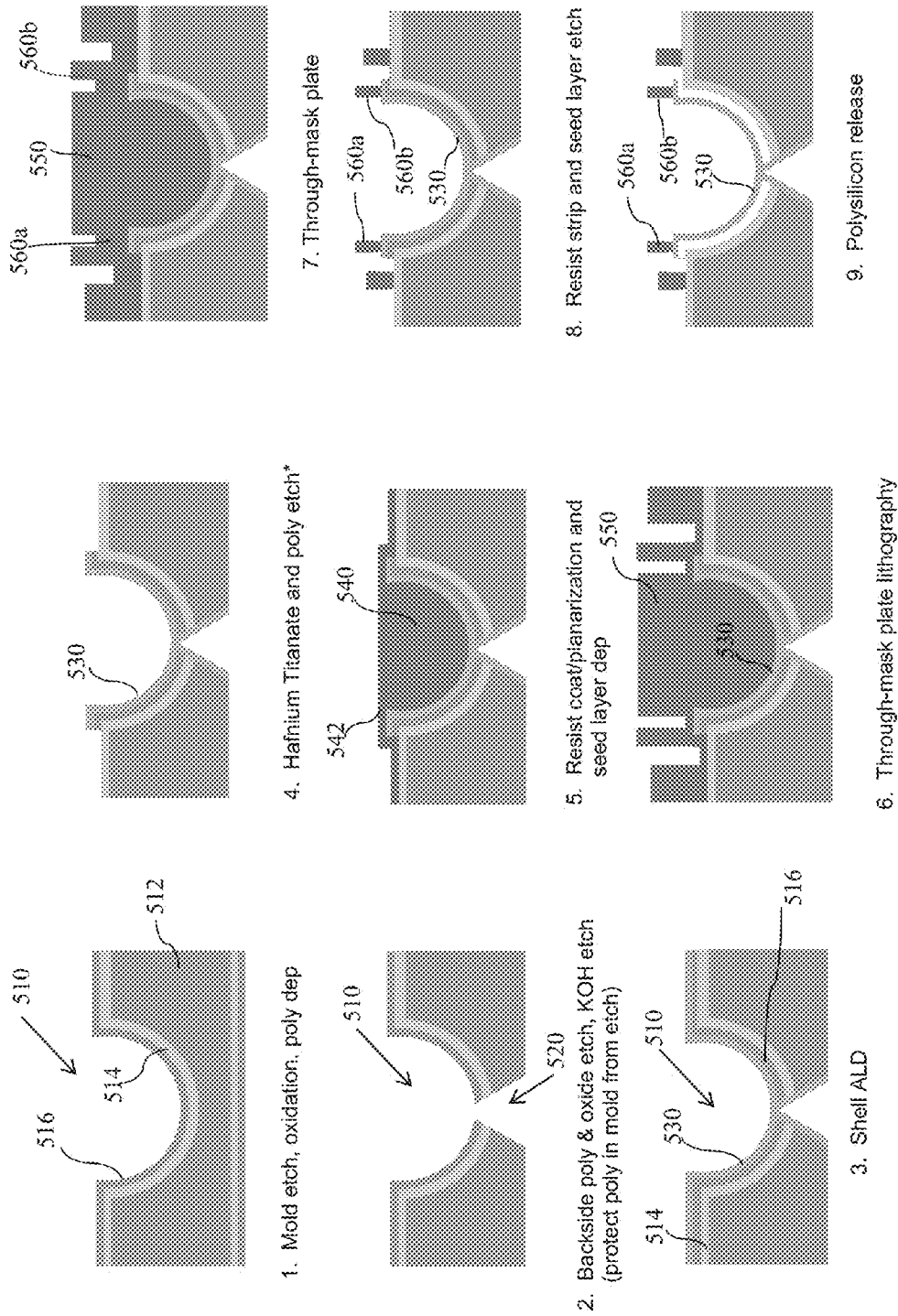
FIG. 5 is a diagram showing stages in the construction/fabrication of the hemispherical resonator.

An example embodiment of fabrication of a hemispherical shell resonator comprising substantially $HfO2_2$—$TiO_2$ material is illustrated with reference to FIG. 5 showing stages in the construction/fabrication of the hemispherical shell resonator. As illustrated in Diagram 1 of FIG. 5, in some implementations, a hemispherical mold is provided. For example, a hemispherical mold 510 can be produced by performing isotropic etching on a base 512 from a suitable material (such as <111> silicon). Once the etchable material has been etched to define the hemispherical mold, the upper surface of the silicon mold may undergo oxidation to produce a $SiO_2$ layer 514. A poly-Si sacrificial layer 516 is deposited on the $SiO_2$ layer. In some variations, the mold may be formed using a $SiO_2$ material. Other appropriate mold structures/materials may also be used.

In implementations in which the hemispherical shell resonator includes a stem structure, the mold 510 is further etched, as depicted in Diagram 2 of FIG. 5, to produce a stem structure 520 to define a mount. Having produced the mold structure, a deposition technique, such as atomic layer deposition (ALD), is performed to fabricate a hemisphere structure 530 (as shown in Diagram 3 of FIG. 5). Thus, layers of $HfO2_2$—$TiO_2$ are deposited (sequentially, with $HfO_2$ and $TiO_2$ layers deposited alternatingly, or with $HfO_2$ and $TiO_2$ layers co-deposited). The deposition operations are performed until a desirable thickness of the hemispherical shell, fabricated from a $HfO_2$—$TiO_2$ material combination, is achieved that provides the hemispherical shell with independent structural integrity. Note that in some variations, the deposited layers may be all $HfO_2$—$TiO_2$, or, in some variations, the layers deposited may be $HfO_2$—$TiO_2$ with one or more metallic layers, where the one or more metallic layers, used, for example, to apply a bias voltage, may be positioned within the bulk of the hemispherical structure (for example, at the mid-plane of the structure) or the inner/outer surfaces. In such implementations, one or more metallic layer may be placed (e.g., through a deposition process or some other suitable process to place a metallic layer on other material) on one of the $HfO_2$—$TiO_2$ layers. Where the metallic layers is to be placed within the hemispherical shell, upon placement of the metallic layer on the deposited $HfO_2$—$TiO_2$ layers, further $HfO_2$—$TiO_2$ layers (be it individual $HfO_2$ layers and $TiO_2$ layers that are sequentially deposited, or co-deposited $HfO_2$—$TiO_2$ layers) are deposited on the metallic layer. In embodiments in which a metallic layer is also deposited, the resultant hemispherical shell resonator is still one comprising substantially the $HfO_2$—$TiO_2$ material in that, for example, at least 50% of the resultant shell's weight and/or at least 50% of the resultant shell's thickness is attributed to the $HfO_2$—$TiO_2$ layers.

With the structural layers of the hemisphere shell structure 530 deposited, the hemisphere structure 530 is etched (as depicted in Diagram 4 of FIG. 5) to define the rim of the hemisphere structure 530. In some variations, additional processes may be performed on the resultant hemisphere structure, including annealing processes, etc.

As will be described in greater details below, in embodiments in which the hemisphere shell's equivalent mass is to be increased by distributing masses along, for example, the rim of the hemisphere shell, the fabrication process depicted in FIG. 5 includes further operations. For example, in some variations, a resist layer and plating seed layer are deposited on the shell 530, as shown in Diagram 5 of FIG. 5. Particularly, as illustrated, a resist material 540 is used to temporarily fill the hemisphere to enable the metal seed layer 542 to be deposited on the top surface of the filler resist material 540. A plating mold 550 is then formed (Diagram 6 of FIG. 5) by, for example, placing (e.g., through a deposition process, or some other suitable placement process) a thick photosensitive resist material that is subsequently patterned to allow shaped metal plating. Masses (e.g., masses 560*a* and *b*) used to increase the hemisphere's equivalent mass are added (e.g., through electroplating), as shown in Diagram 7 of FIG. 5. The resist layer is subsequently stripped and the seed layer etched (as shown in Diagram 8 of FIG. 5), and the resultant hemisphere, including the hemispherical shell 530 comprising substantially $HfO_2$—$TiO_2$ material and the added masses 560*a* and 560*b*, are released from the polysilicon layer 516 (as shown in Diagram 9 of FIG. 5).

Figure 6A:
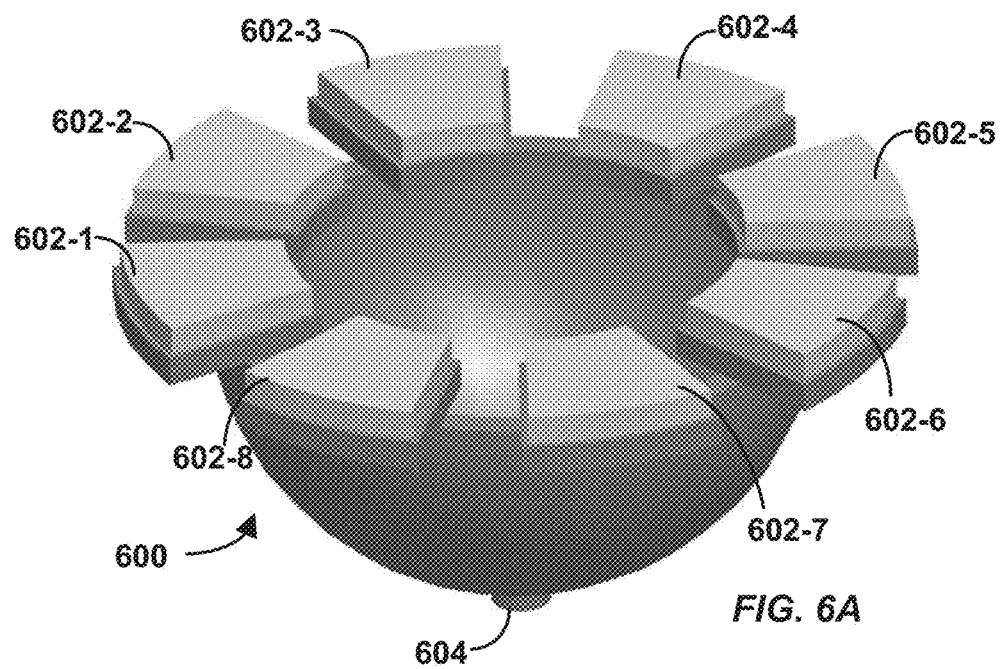
FIGS. 6A-6B are a perspective view and a top view, respectively, of an example hemispherical resonator with pie-shaped masses distributed along a periphery of a rim of the resonator.
Figure 6B:
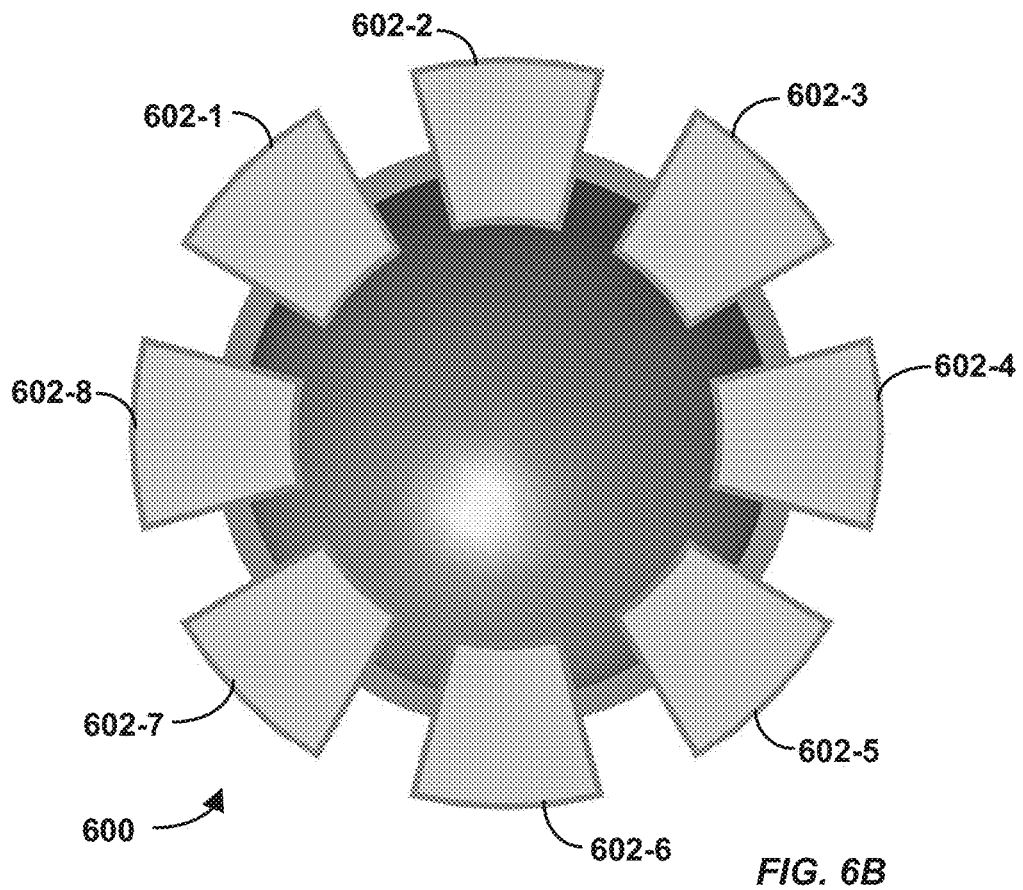

The addition of distributed masses to the hemispherical shell can improve performance of the gyroscope's ring down time. Changes to the gyroscope's hemispherical resonator's equivalent mass can be performed instead of or in addition to controlling the thermal expansion coefficient of the resonator through fabrication of a hemispherical shell substantially from a $HfO_2$—$TiO_2$ material. Thus, FIGS. 6A-6B show a hemispherical resonator 600 whose equivalent mass is controlled by the addition of masses to the trim of the hemispherical shell. Hemispherical resonator 600 may be supported by a stem 604. Distributed masses 602 (which may have been placed in a manner similar to the placement of the masses 560*a* and 560*b* in FIG. 5) may be positioned on the rim of the hemispherical resonator 600 in order to increase the resonator's equivalent mass. In some variations, the distributed masses 602 may be made of any heavy material (e.g., a heavy metal) conducive, for example, to micro-scale fabrication, including gold, platinum, tungsten, lead, any combination thereof, or other materials. The use of a heavy metal for the distributed masses 602 may optimize the mass increase given a confined geometric form factor of the gyroscope. In some variations, the distributed masses 602 may be fabricated using electroplating.

The distributed masses 602 may be positioned around the periphery of the outer rim of the hemispherical resonator 600. The masses may be positioned at points of maximum deflection or velocity of the resonator. For example, in some variations, in a resonator using cos 2θ vibrational modes, eight masses may be distributed at approximately 45 degree increments around the periphery of the outer rim of the hemispherical resonator 600. More or fewer masses may be positioned around the periphery of the outer rim of the hemispherical resonator 600. In some variations, the shape of each mass may take any shape that is symmetric about the radial vector going out to that mass. For example, circular, square, rectangular, or pie-shaped wedge masses may be used. In some variations, the weight of the masses may be substantially identical, and may depend on several factors, including, for example, expected damping levels and the desired ring down time, τ. In other embodiments, the weights of the masses may vary about the periphery of the hemisphere with heavier masses located at maximum points of deflection associated with the vibrational modes of the resonator. Lighter masses may be positioned between points of maximum deflection, equally spaced around the periphery of the hemisphere.

FIG. 6B is a top view of the hemispherical resonator 600, showing the eight distributed masses 602 spaced equally around the outer rim of hemispherical resonator 600. As noted, more or fewer masses may be positioned around the periphery of the outer rim of the hemispherical resonator 600. The actual number of masses selected for distribution on the hemispherical resonator 600 may be based, at least in part, on the vibrational modes used to drive the hemispherical resonator 600. As mentioned above, if two cos 2θ vibrational modes are used, then eight (8) masses may be positioned at points of maximum deflection of the hemispherical resonator 600. If higher order vibrational modes are used to drive the hemispherical resonator 600, then a greater number of masses may be positioned around the periphery of the outer rim of the hemispherical resonator 600. For example, in some variations, 10, 12, 16, 18, 24, or more masses may be positioned around the periphery of the outer rim of the hemispherical resonator 600.

Figure 7A:
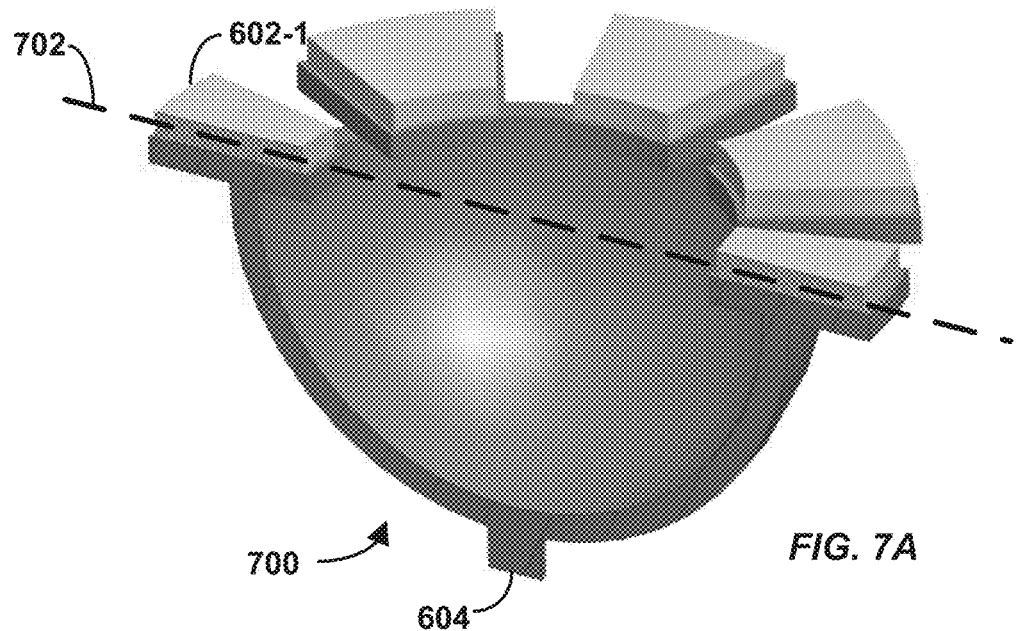
FIGS. 7A-7B are a perspective view and a side view of a cross-section of the illustrative resonator of FIGS. 6A-6B.
Figure 7B:
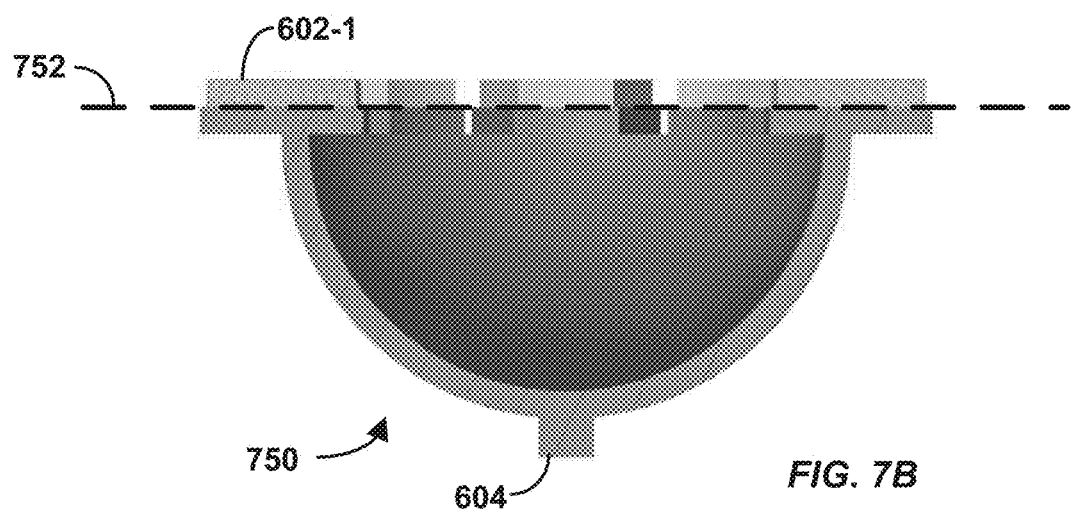

FIGS. 7A-7B illustrate additional views, 700 and 750, of the hemispherical resonator 600 of FIGS. 6A and B. As shown in the view 700, the shape of mass 602-1 may be symmetric about a radial vector 702 going out to that mass. Although pie-shaped wedges are shown in the example of FIGS. 7A-B, other shapes may be used for the masses, including circular, square, or rectangular masses. In cross-sectional side view 750 of the hemispherical resonator 600, a mass 602-1 can be seen affixed to the outer rim of hemispherical resonator 600 on the plane 752. The mass 602-1, like the other masses affixed to the outer rim of hemispherical resonator 600, may be affixed using any suitable technique. For example, as described in connection to FIGS. 8A-8B and 9, below, the masses may be patterned using electroforming of a heavy metal, such as gold, platinum, tungsten, lead, etc.

Figure 8A:
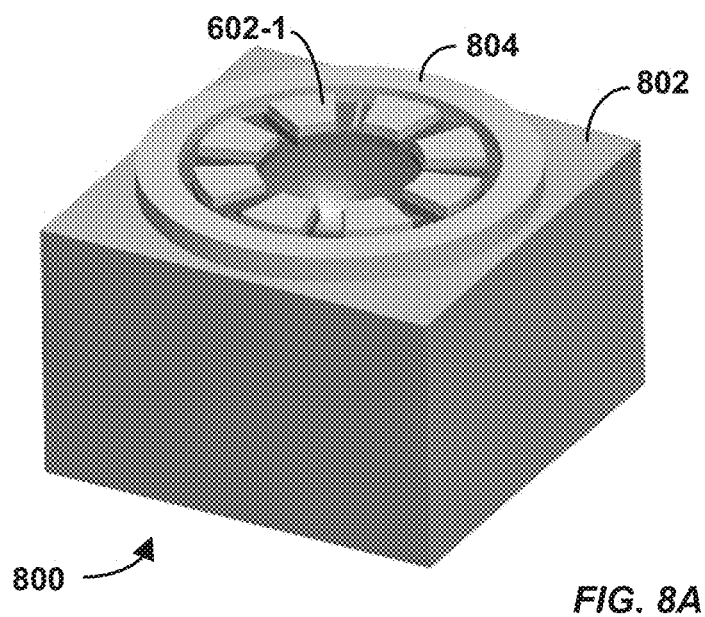
FIGS. 8A-8B are a perspective view and a perspective cross-sectional view of an example gyroscope assembly used in manufacturing the gyroscope shown in FIG. 3.
Figure 8B:
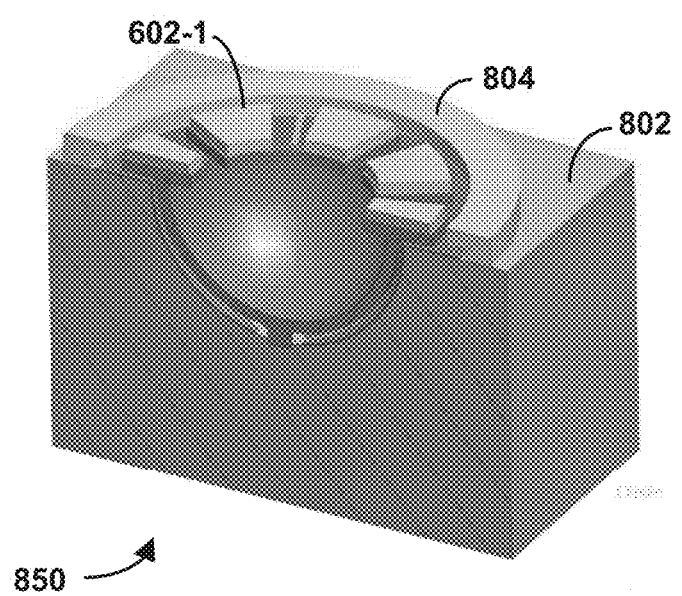

FIGS. 8A-8B show a hemispherical resonator gyroscope assembly 800 which may be used to manufacture a gyroscope with a hemispherical resonator such as the hemispherical resonators 300 and 600 of FIGS. 3 and 6A-B. The hemispherical resonator gyroscope assembly 800 may be used to manufacture a hemispherical resonator using a procedure similar to that described in relation to FIG. 5. Thus, in some variations, a deposition procedure (such as ALD) may be performed to deposit a thin film oxide into micro-mold 802, where the mold may eventually become part of the entire assembly. In some implementations, the material deposited into the mold to form the hemispherical shell of the resonator is a material combination of $HfO_2$—$TiO_2$, to thus provide a hemispherical resonator with a low (e.g., near-zero) thermal expansion (which in turn would provide a resonator with a low damping coefficient). Prior to the deposition of the layers of the selected material (be it a $HfO_2$—$TiO_2$ material combination, or some other material), metal electrodes may be deposited and patterned to form pickoff electrodes. After depositing the electrodes, a sacrificial layer is deposited to define the gap between the hemisphere and the electrodes. As noted, the hemisphere is then formed using deposition techniques such as atomic layer deposition. As was noted in relation to FIG. 5, in some variations, the construction/fabrication of the hemispherical resonator may also include placing a (thin) metal film either on the inner surface, outer surface, or within the bulk of the hemisphere to provide electrical contact used in the electrostatic transduction of the hemisphere. Where the metal layer/film is placed within the bulk of the shell (e.g., the metal layer is encased in layers of, for example, $HfO_2$—$TiO_2$ material combination used to define the hemispherical shell), in addition to providing electrical contact, the metal layer within the bulk of the hemisphere (and thus not in direct contact with the high stress bending areas of the vibrating hemisphere) can further decrease damping losses in the metal film, enabling to further lower the damping coefficient of the hemisphere structure. After the deposition of a material to fabricate the shell of the hemispherical resonator, the hemisphere, masses 602 may be added using electroforming of a heavy metal, such as gold, platinum, tungsten, lead, etc. In addition to creating the masses, the electroforming may also simultaneously add forcer ring 804 about the periphery of the hemisphere to provide the electrostatic forces for driving the structure. Following the electroforming process, the sacrificial layer may be released to form a free-standing hemisphere connected to a substrate via a stem (e.g., stem 604 shown in FIG. 6A) located at the base of the hemisphere.

Figure 9:
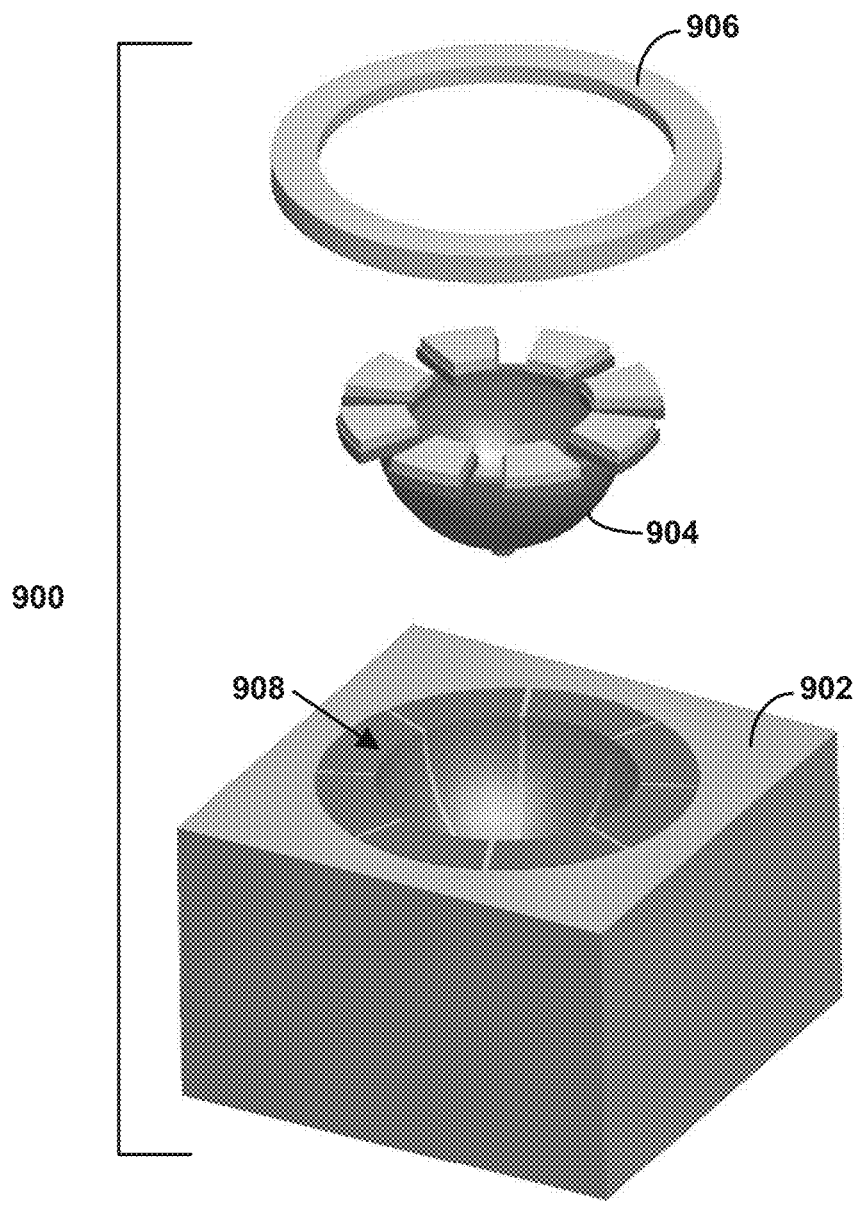
FIG. 9 is an exploded perspective view of the mold shown in FIGS. 8A-8B.

FIG. 9 is an exploded view of another example assembly 900 for the manufacture of a hemispherical resonator gyroscope. Assembly 900 includes substrate 902, which may be composed of silicon. A mold may be created using isotropic etching of the substrate 902. Metal electrodes 908 may then be patterned to serve as the pickoff electrodes. Although eight electrodes 908 are shown in the example of assembly 900, more or fewer electrodes may be included in implementations of the assembly (e.g., 12 or 16 electrodes). A shell of a hemispherical resonator 904 may be fabricated using various deposition procedures (e.g., layered deposition procedures). In a manner similar to that described in relation to FIGS. 1, 2, 5, and 8, layers of a material based on a $HfO_2$—$TiO_2$ material combination may be deposited on a sacrificial release layer.

Heavy metal masses, adapted and placed on the shell of the hemispherical resonator to increase its equivalent mass, are then patterned on the hemispherical resonator. A forcer electrode 906 may be formed simultaneously with the masses using, for example, an electroforming technique. The forcer electrode 906 is configured to drive the hemispherical resonator 904. Although electrostatic actuation (e.g., to excite and drive the gyroscope oscillator) is used in some variations, other actuation techniques, such as piezoelectric, magnetic, thermal, or optical actuation may also be used. In such cases, a piezoelectric, magnetic, thermal, or optical actuator may replace, or supplement, the forcer electrode 906. In addition, although capacitive sensing or detection mechanisms may be used in some variations, other forms of sensing or detection (such as piezoelectric, piezoresistive, optical, or magnetic sensing) may also be used. Thus, in some variations, the metal electrodes 908 may be replaced, or supplemented, by suitable piezoelectric, piezoresistive, optical, or magnetic sensing elements or sensors.

Figure 10:
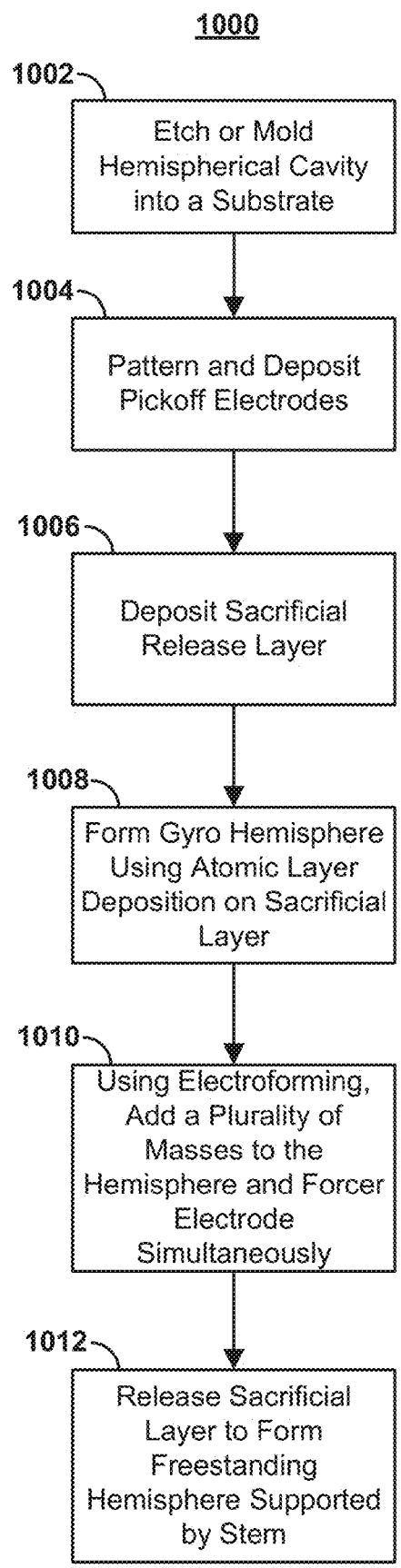
FIG. 10 is a block flow diagram of an example process for manufacturing the gyroscope shown in FIG. 3.

Referring to FIG. 10, with further reference to FIGS. 1-9, a flowchart of a process 1000 to construct a gyroscope such as any of the gyroscopes described herein, is shown. The process 1000 is, however, an example only and is not limiting. The process 1000 can be altered, e.g., by having operations added, removed, rearranged, combined, and/or performed concurrently either partially or completely.

As shown, a hemispherical cavity is etched or molded 1002 into a substrate. For example, the substrate may be composed of silicon in some variations. Pickoff electrodes are then pattered and deposited 1004. For example, the pickoff electrodes may be patterned and deposited on a substrate such as the substrate 902 of FIG. 9. A sacrificial release layer is deposited 1006 so as to define the gap between a hemispherical resonator and the electrodes. A shell of the hemispherical resonator may be formed using, for example, atomic layer deposition or chemical vapor deposition, of a material such as a $HfO_2$—$TiO_2$ material combination on the deposited sacrificial release layer. Using, for example, an electroforming process, a plurality of masses may be added 1010 to a rim of the shell of the hemispherical resonator. A forcer ring electrode may be added simultaneously with the plurality of masses during the same electroforming operation, or may be added separately during a separate electroforming operation. The sacrificial layer is released 1012 to provide a free-standing hemispherical resonator supported by a stem.

Although the procedure 1000 describes one technique/procedures for creating a gyroscope, many other techniques/procedures may be used as well. For example, in some variations, micro-molding may be used in place of, or in addition to, the atomic layer deposition. As another example, a wet or dry etching process may be used in place of, or in addition to, the deposition procedures described herein. Other suitable manufacturing processes may also be used.

Figure 11:
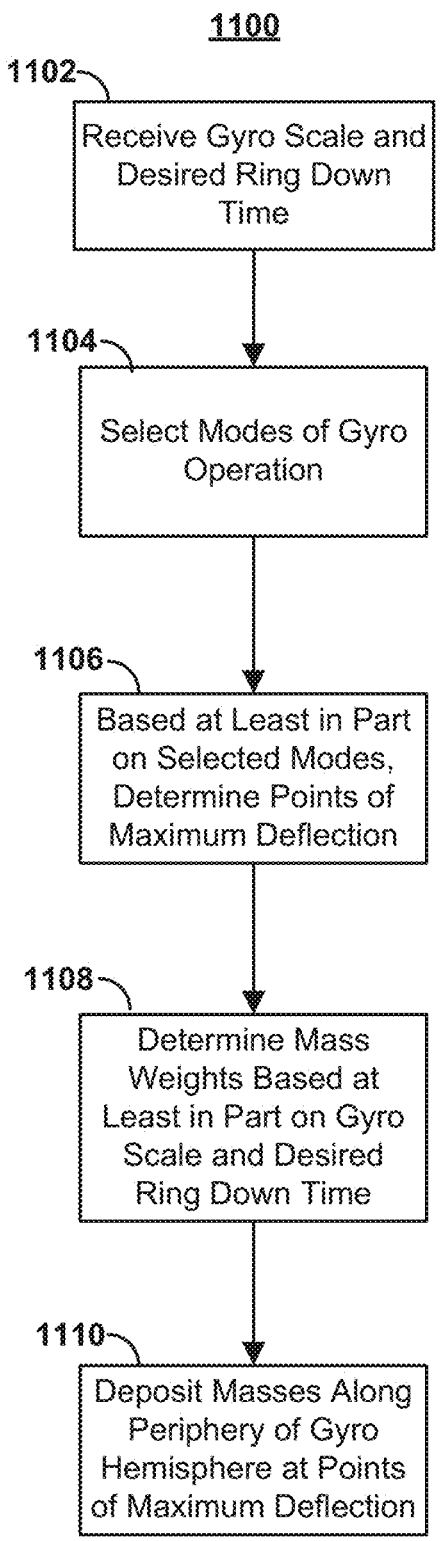
FIG. 11 is a block flow diagram of an example process for distributing masses along the rim of the resonator shown in FIGS. 6A-6B.

Referring to FIG. 11, an example process 1100 to deposit masses on a resonator, such as any of the resonators described herein, is shown. The process 1100 is, however, an example only and is not limiting. The process 1100 can be altered, e.g., by having stages added, removed, rearranged, combined, and/or performed concurrently either partially or completely.

Thus, as illustrated in FIG. 11, a desired gyroscope scale and a desired ring down time are received 1102. For example, specifications referencing a micro-scale gyroscope with a 2 mm resonator diameter and a ring down time of 500 seconds may be received. Based at least in part on the received specifications, modes of operation of the gyroscope may be selected 1104. For example, as described above, commonly used vibrational modes in a hemispherical resonator of a gyroscope include cos 2θ modes. Higher or lower order modes may also be selected. Points of maximum resonator deflection are determined 1106 based, at least in part, on the selected vibrational modes. For example, using the cos 2θ modes mentioned above, there are eight points of maximum deflection with each point separated by approximately 45 degrees around the peripheral of the resonator. Weights for masses to be positioned at the points of maximum deflection are computed 1108 based, at least in part, on the desired ring down time. In some variations, selection of a material with which to construct (fabricate) the hemispherical shell of the hemispherical resonator may also be performed. For example, a material based on a $HfO_2$—$TiO_2$ material combination may be chosen, and its thermal expansion coefficient determined (either through empirical data or from established data tables for the chosen material). The weights of the masses to be positioned on the hemispherical shell may be then be determined based, at least in part, on the characteristics of the chosen material (e.g., based on the thermal coefficient of the material). The masses are deposited 1110 along the periphery of the resonator of the gyroscope in order to increase the equivalent mass of the resonator. The masses may be positioned at points of maximum deflection or velocity of the resonator. For example, as shown in the example of FIG. 6, eight masses may be positioned along the outer rim of the resonator 600 (FIG. 6) approximately 45 degrees apart from one another. This positioning may correspond to the eight points of maximum deflection of the resonator using the two cos 2θ modes mentioned above. The eight points of maximum deflection of the resonator may result from initial vibratory oscillation pattern 404 (as depicted in FIG. 4) and precessed oscillation pattern 406 corresponding to structural modes 400 and 402. Additional or fewer masses may be positioned on the resonator in other embodiments.

As noted, in some variations, the shape of each mass may take a shape that is symmetric about the radial vector going out to that mass. For example, circular, square, rectangular, or pie-shaped wedge, or other shape masses may be used. The weights of the masses may be substantially identical in some variations, and may depend on several factors, including, for example, expected damping levels and the desired ring down time, τ (which may, in turn, depend on characteristics of the material selected for construction of the one or more structured components of the resonator). In other embodiments, the weights of the individual masses may vary about the periphery of the hemisphere with heavier masses located at maximum points of deflection associated with the vibrational modes of the resonator. Lighter masses may be positioned between points of maximum deflection, equally spaced around the periphery of the hemisphere.

Figure 12:
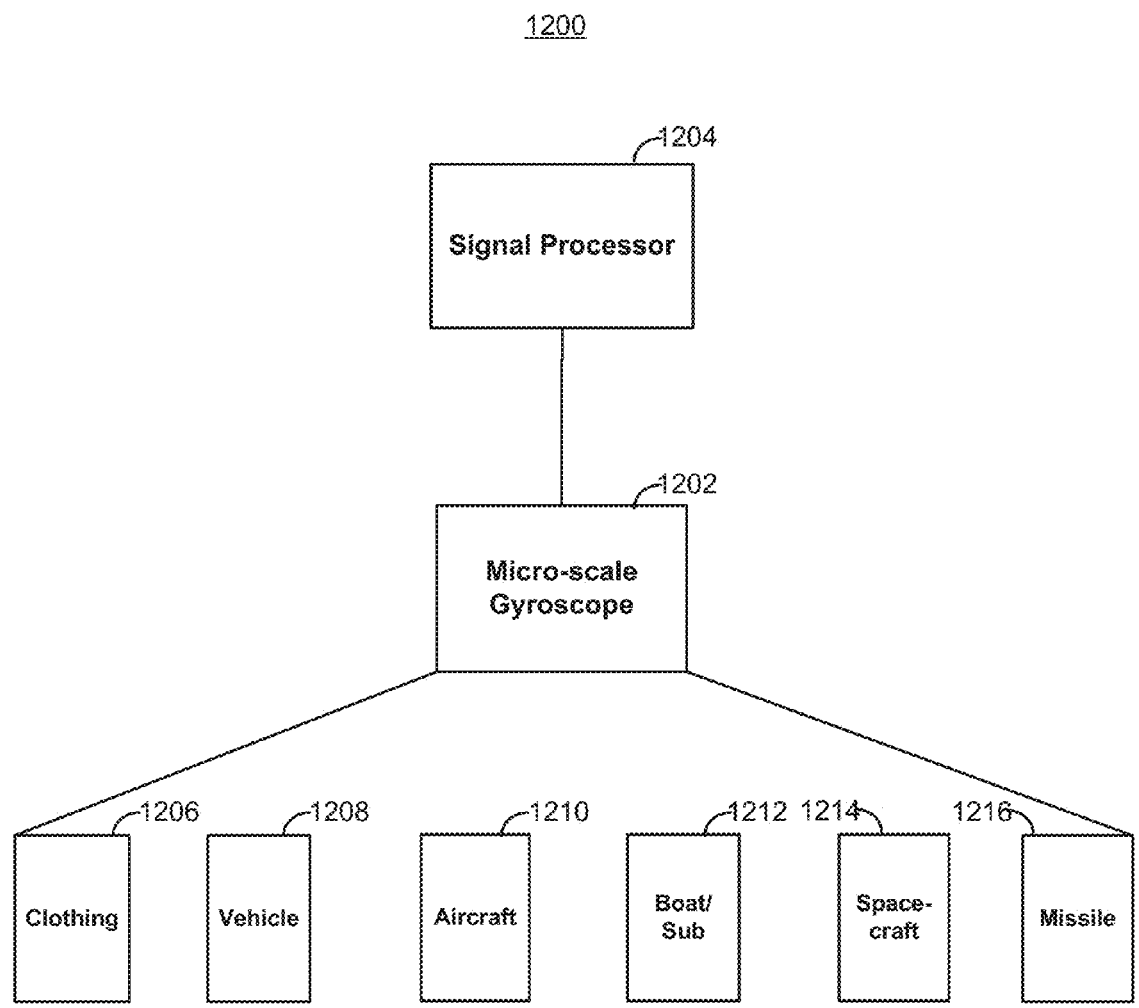
FIG. 12 is a block diagram of an example micro-scale gyroscope application system.

The gyroscopes described herein may be used in various applications. For example, FIG. 12 shows an application system 1200 that includes a gyroscope (e.g., micro-scale gyroscope) 1202 and a signal processor 1204. The gyroscope 1202 may be used in a wide range of personal and mobile applications. The gyroscope 1202 may include a hemispherical resonator with, for example, a 2 mm diameter (but may be larger or smaller) and a total form factor of, for example, less than 3 mm. The signal processor 1204, which may include signal processing circuitry, such as a digital signal processor (DSP), or may include a general purpose processor, may be coupled to the gyroscope 1202. The signal processor 1204 is configured to process received measurements from the gyroscope 1202 on a periodic, continuous, or near continuous basis in order to determine rotation rate or rotation angles of the gyroscope. The signal processor 1204 may also filter, amplify, enhance, or equalize any of the signals received from the gyroscope 1202 as well as control the modes of operation of the gyroscope 1202.

As further shown in FIG. 12, illustrative applications of gyroscope 1202 include, for example, use in clothing 1206, a motor vehicle 1208, an aircraft 1210, a boat or a submarine 1212, a space craft, a guided missile 1216, and other applications where direction/rotational sensors, including such sensors implemented using gyroscopes, are used. In embodiments in which a micro-scale gyroscope is implemented, the gyroscope 1202 may be embedded in, or attached to, the clothing 1206 associated with an object (e.g., an animal or person). The clothing 1206 may take the form of wearable garments including shoes, boots, hats, helmets, gloves, or any other suitable clothing or accessory. The gyroscope 1202 may be embedded inside the clothing 1206 (e.g., within the sole or tongue of a boot or shoe) so as to be permanently or semi-permanently affixed thereto. The clothing 1206 may also include jewelry, such as a bracelet or watch. The gyroscope 306 may be attached to the piece of jewelry (e.g., as a functional unit) or embedded therein.

In some variations, the gyroscope 1202 may be part of a tracking, positioning, or location system. In some variations, the gyroscope 1202 may also be embedded in, or included as part of, a navigation system of a motorized moving object, such as the motor vehicle 1208, the aircraft 1210, the boat or a submarine 1212, the spacecraft 1214, etc. In some variations, the gyroscope 1202 may also be mounted on a propelled object, such as the guided missile 1216, and may be used as part of the guidance system of the propelled object.

Figure 13:
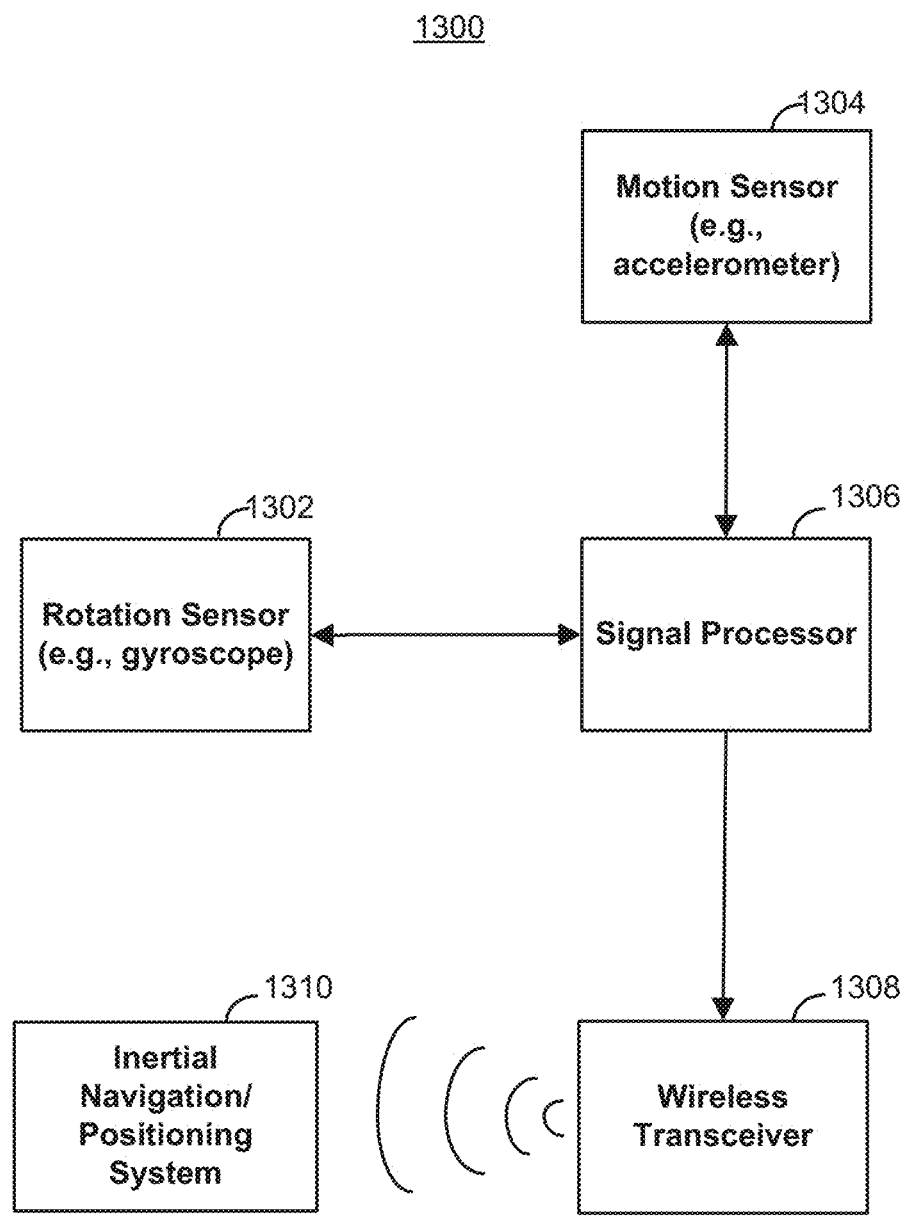
FIG. 13 is a block diagram of an example navigation system.

FIG. 13 shows a navigation/positioning system 1300 that includes a rotation sensor 1302, a motion sensor 1304, a signal processor 1306, a wireless transceiver 1308, and an inertial navigation/positioning system 1310. The rotation sensor 1302 (which may be similar to the gyroscopes described in relation to any of FIGS. 3-12) may measure the rotation rate or rotation angle of an object associated with the rotation sensor 1302 (e.g., a person, motor vehicle, aircraft, submarine, etc.) An output of the rotation sensor 1302 may be provided to the signal processor 1306. The signal processor 1306 may include one or more microprocessors, analog-to-digital converters, filers, amplifiers, control logic, and related circuitry for processing the output of the sensor 1302, and may perform any suitable signal processing operation (e.g., filtering, amplification, or equalization) on any of its inputs. The signal processor 1306 may be configured to convert one or more outputs of the sensor 1302 into a rotation rate or rotation angle.

The signal processor 1306 may also receive outputs from one or more instance of the motion sensor 1304. The motion sensor 1304 may include any type of motion detector or sensor, including, for example, a single-axis or multi-axis accelerometer. The signal processor 1306 may convert an output of the motion sensor 1304 into, for example, an acceleration quantity relative to an inertial frame. The signal processor 1306 may be in communication with, or electrically coupled to, the wireless transceiver 1308. The wireless transceiver 1308 may wirelessly transmit the rotation and/or motion measurements from the rotation sensor 1302 and/or the motion sensor 1304 to the inertial navigation/positioning system 1310. The inertial navigation/positioning system 1310 may determine, for example, the location, direction (e.g., orientation), and velocity of an object associated with the rotation sensor 1302 and/or motion sensor 1304. For example, the inertial navigation/positioning system 1310 may determine the location, direction, and velocity of one or more of a person associated with the various applications/objects of FIG. 12, including, for example, the clothing 1206, the vehicle 1208, the aircraft 1210, the boat or the submarine 1212, the spacecraft 1214, the missile 1216, etc.

The signal processor 1306 may also control the operation of the rotation sensor 1302, the motion sensor 1304, or both. For example, the signal processor 1306 may determine the frequency of measurements and the duration and modes of operation of the rotation sensor 1302, the motion sensor 1304, or both. The signal processor 1306 may query one or more of the rotation sensor 1302 and the motion sensor 1304 for updated measurements periodically (e.g., on a regular schedule, for example, every second), continuously, or after some predefined event (e.g., supporting event-driven inquiries).

Figure 14:
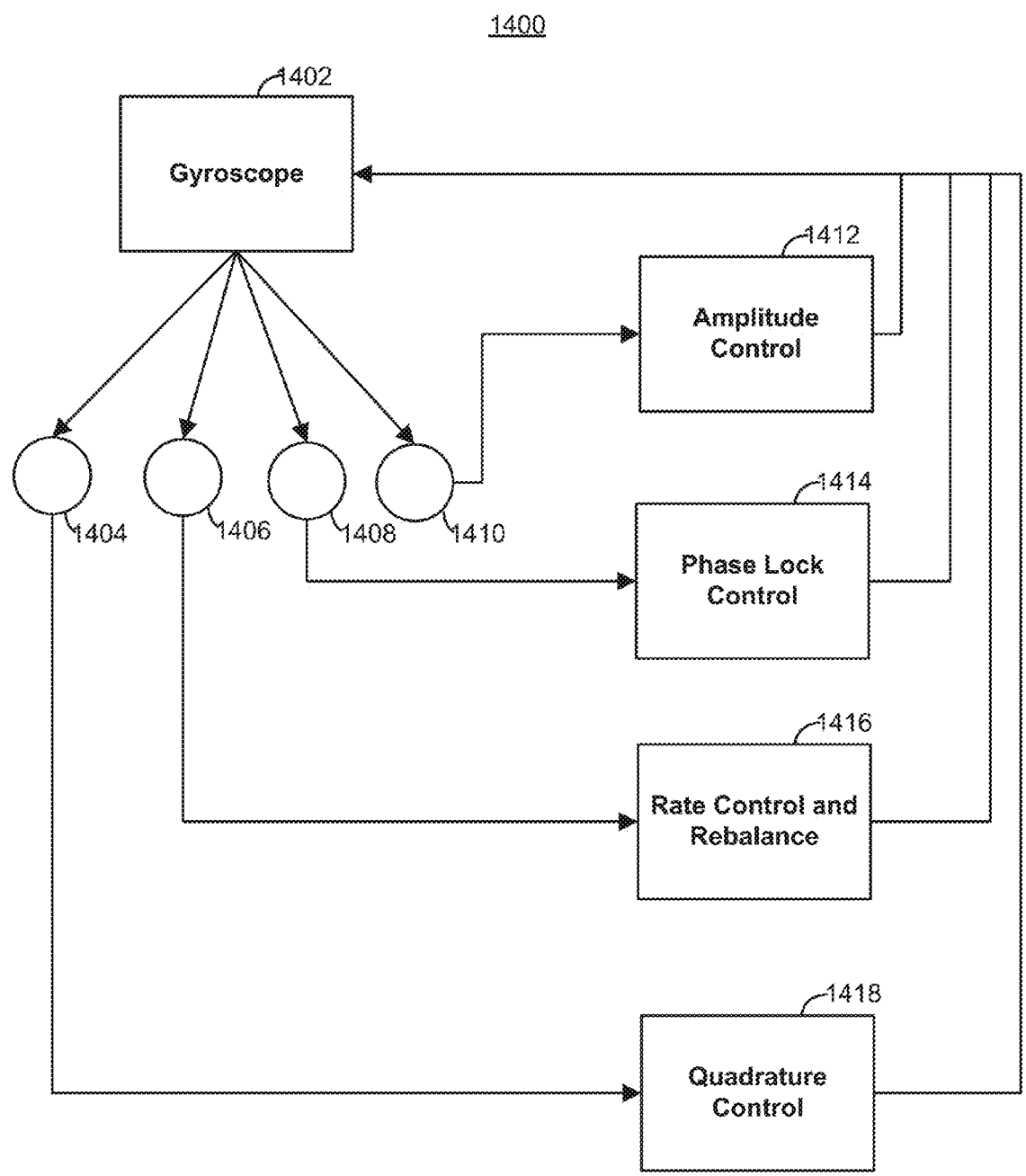
FIG. 14 is a block diagram of example control loops for controlling a gyroscope.

With reference to FIG. 14, a schematic diagram of a gyroscope arrangement 1400 to implement a control loop to control operation of a gyroscope 1402 (which may be similar to any of the gyroscopes described in relation to FIGS. 3-13). The small amplitudes of shell deformation of a resonator associated with the gyroscope 1402 may correspond to a principal standing wave and a secondary standing wave. When the principal standing wave and secondary standing wave are in phase (and in the special case in which they are of equal amplitude), the result of superposing the principal standing wave and secondary standing wave is a similar standing wave whose lobes (e.g., antinodes) and nodes are midway between the antinodes and nodes of the principal standing wave and secondary standing wave.

To control the gyroscope 1402, one of the standing waves may be maintained (e.g., either the principal standing wave or the antinodal wave) at a prescribed amplitude. The other wave (e.g., the secondary standing wave or nodal-quadrature wave) may be driven to null. In rebalance mode, additional forces may be developed to maintain the standing wave in a fixed location. To implement the control loop of the arrangement 1400, the outputs of the pickoff electrodes associated with the gyroscope 1402 are processed to provide signals proportional to the oscillating amplitudes of the principal (antinodal) standing wave and the nodal-quadrature wave. In a rebalance operation, the readout signals may provide the desired signals because the pickoff electrodes may be positioned directly over the antinodes and nodes of the antinodal and nodal-quadrature waves.

The antinodal and nodal-quadrature signals may be demodulated with respect to the signals from a reference oscillator to provide outputs that are proportional to their oscillatory components that are in phase (e.g., antinodal cosine output 1410 and nodal cosine output 1406) and in quadrature (antinodal sine output 1408 and nodal sine output 1404) with the reference oscillator. The frequency and phase of the reference oscillator may be controlled by a phase lock loop that adjusts the frequency and phase of the reference oscillator so as to drive antinodal sine output 1408, for example, to zero. Driving the antinodal sine output 1408 to zero may lock the reference oscillator to the frequency and phase of the principal (e.g., antinodal) wave. The antinodal cosine output 1410 may then provide a measure of the amplitude of the principal standing wave and may be used as the control variable by amplitude control logic 1412 used to maintain the amplitude at a prescribed value.

Phase lock control logic 1414 may maintain the phase of the reference oscillator equal to the phase of the antinodal wave. The nodal sine output 1404 may be proportional to the amplitude of the nodal quadrature wave. The nodal sine output 1404 may therefore be used as the control variable in the closed loop that drives the amplitude of the nodal-quadrature wave to null (e.g., using the quadrature control logic 1418), thus ensuring that the principal wave is a pure standing wave.

A rebalance operation may be performed (e.g., using rate control and rebalance logic 1416) by exerting forces of the correct phase at the standing wave nodes so as to null or zero out the nodal cosine output 1406. The amplitude of the force required is related to the rotation rate of the gyroscope 1402 that is attempting to rotate the standing wave and thus create a non-zero nodal cosine output 1406. As noted, during a rebalance operation, the pickoff electrodes may define the location of the antinodes and nodes of the two waves and therefore the demodulated electrode outputs can be used directly as the control variables in the various loops.

The phase lock loop controlled by the phase lock control logic 1414 may be a feedback loop, which detects and converges on the unique resonant frequency and phase of the gyroscope 1402. The output of this control loop may generate a specific frequency control to digital signal processing, which maintains the correct rate and phase of the nodal and antinodal samplings.

Figure 15:
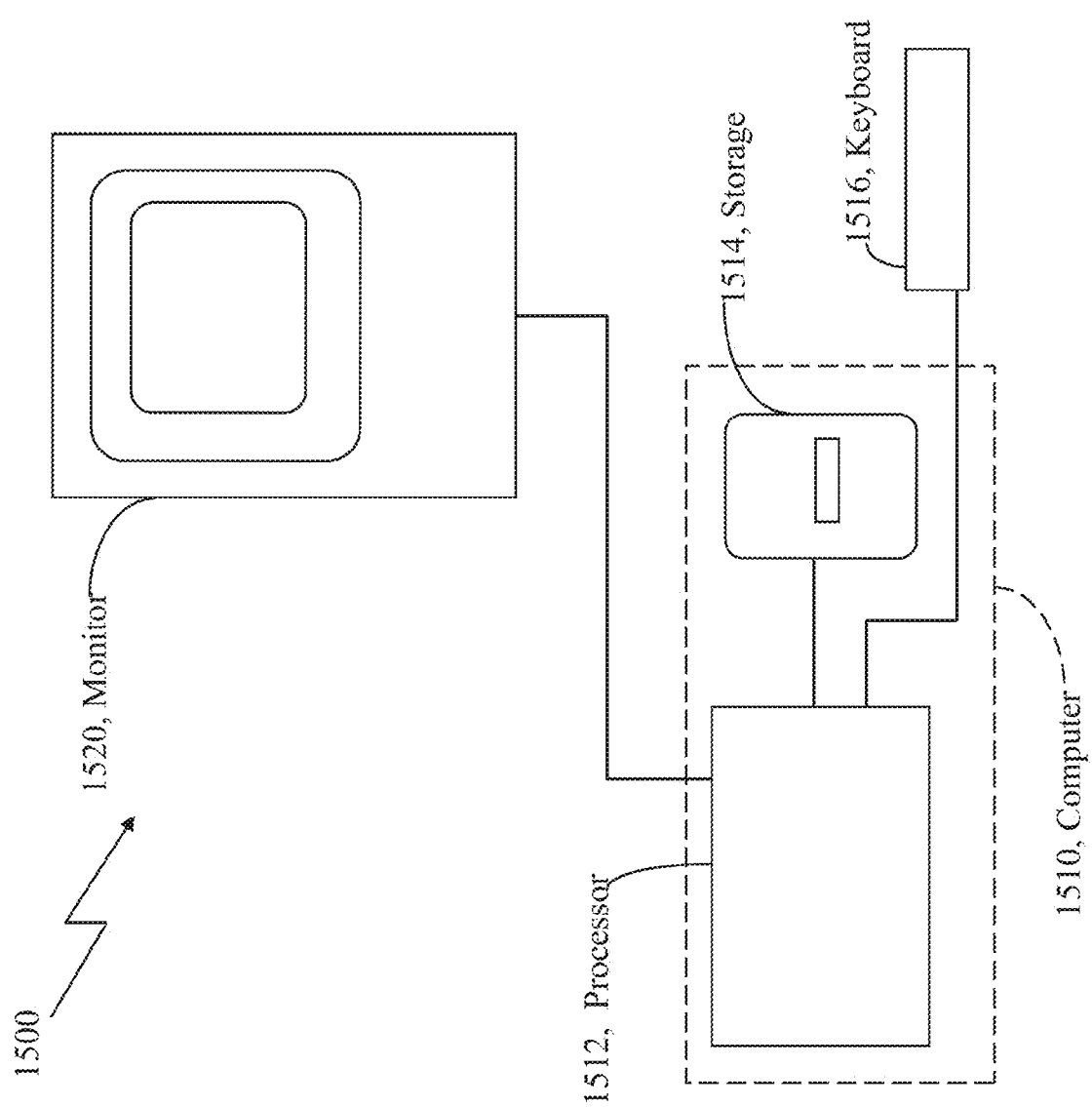
FIG. 15 is a schematic diagram of a generic computing/processing system.

Some of devices, units, modules described herein, including, for example, the various units, devices and modules described in relation to FIGS. 12-14 (e.g., signal processors 1204 and/or 1306), may be implemented, at least in part, using a processor-based device. With reference to FIG. 15, a schematic diagram of a generic computing/processing system/device 1500 is shown. The computing system 1500 includes a processor-based device 1510 such as a personal computer, a specialized computing device, and so forth, that typically includes a central processor unit 1512. In addition to the CPU 1512, the system may include a main memory, cache memory and bus interface circuits (not shown). The processor-based device 1510 may include a mass storage element 1514, such as a hard drive and/or a flash drive associated with the system. The system 1500 may include, in some variations requiring direct user interaction, a keyboard, or keypad, 1516, and a monitor 1520, e.g., a CRT (cathode ray tube) or LCD (liquid crystal display) monitor, that may be placed where a user can access them.

The processor-based device(s) 1510 is configured to facilitate, for example, the implementation of at least some of the procedures, processes, and/or operations described herein. The storage device 1514 may include a computer program product that when executed on the processor-based device 1510 causes the processor-based device to perform operations to facilitate the implementation of the above-described procedures/processes/operations. The processor-based device may further include peripheral devices to enable input/output functionality. Such peripheral devices may include, for example, a CD-ROM drive and/or flash drive, a network connection (implemented using, for example, a USB port, a wireless transceiver, etc.), for downloading related content to the connected system. Such peripheral devices may also be used for downloading software containing computer instructions to enable general operation of the respective system/device. Alternatively and/or additionally, in some variations, special purpose logic circuitry, e.g., an FPGA (field programmable gate array), a DSP processor (as in the case of, for example, some of the programmable sensors described herein), or an ASIC (application-specific integrated circuit) may be used in the implementation of the system 1500. Other modules that may be included with at least some of the various devices, modules, and machines described herein are speakers, a sound card, a pointing device, e.g., a mouse or a trackball, by which the user can provide input to the computing system 1500. The processor-based device 1510 may include an operating system.

Computer programs (also known as programs, software, software applications or code) include machine instructions for a programmable processor, and may be implemented in a high-level procedural and/or object-oriented programming language, and/or in assembly/machine language. As used herein, the term "machine-readable medium" refers to any non-transitory computer program product, apparatus and/or device (e.g., magnetic discs, optical disks, memory, EPROMS, Programmable Logic Devices (PLDs)) used to provide machine instructions and/or data to a programmable processor, including a non-transitory machine-readable medium that receives machine instructions as a machine-readable signal.

Although particular embodiments have been disclosed herein in detail, this has been done by way of example for purposes of illustration only, and is not intended to be limiting with respect to the scope of the appended claims, which follow. In particular, it is contemplated that various substitutions, alterations, and modifications may be made without departing from the spirit and scope of the invention as defined by the claims. Other aspects, advantages, and modifications are considered to be within the scope of the following claims. The claims presented are representative of the embodiments and features disclosed herein. Other unclaimed embodiments and features are also contemplated. Accordingly, other embodiments are within the scope of the following claims.

What is claimed is:

1. A method comprising:
   depositing one or more layers of $HfO_2$ material and one or more layers of $TiO_2$ material; and
   using the deposited one or more HfO2 layers and the deposited one or more $TiO_2$ layers to produce one or more structural components of a device, at least one of the one or more structural components comprising a hemispherical shell of a hemispherical resonator gyroscope comprising substantially the deposited one or more layers of the $HfO_2$ material and the deposited one or more layers of the $TiO_2$ material.

2. The method of claim 1, wherein the produced structural component of the device is adapted to independently provide structural integrity of the structural component.

3. The method of claim 1, wherein depositing the one or more layers of the $HfO_2$ material and the one or more layers of the $TiO_2$ material comprises: alternatingly depositing the one or more layers of the $HfO_2$ material and the one or more layers of the $TiO_2$ material such that each of the one or more $TiO_2$ layers is deposited adjacent to at least one of the one or more $HfO_2$ layers and is separated from any other of the one or more $TiO_2$ layers by one of the one or more $HfO_2$ layers.

4. The method of claim 1, wherein depositing the one or more layers of the $HfO_2$ material and the one or more layers of the $TiO_2$ material comprises: co-depositing the one or more layers of the $HfO_2$ material and the one or more layers of the $TiO_2$ material.

5. The method of claim 1, further comprising: placing a conductive electrode within the structural component so that opposite surfaces of the electrode each contact respective ones of the deposited one or more $HfO_2$ layers and the deposited one or more $TiO_2$ layers used to produce the structural component.

6. The method of claim 5, wherein placing the conductive electrode comprises: placing the electrode at, or close to, center of the structural component's thickness.

7. The method of claim 1, wherein each of the deposited one or more $HfO_2$ layers and each of the deposited one or more $TiO_2$ layers is associated with a corresponding predetermined thickness so that the structural component of the device comprises substantially $63HfO_2$-$37TiO_2$ material.

8. The method of claim 1, wherein depositing the one or more layers of the $HfO_2$ material and the one or more layers of the $TiO_2$ material comprises: depositing the one or more layers of $HfO_2$ material and the one or more layers of $TiO_2$ material through one or more of: atomic layer deposition manufacturing procedure, and chemical vapor deposition manufacturing procedure.

9. A method comprising: depositing one or more layers of a material to produce a hemispherical shell of a hemispherical resonator gyroscope; and placing a conductive electrode layer within the hemispherical shell so that opposite surfaces of the electrode layer each contact respective at least one of the one or more deposited layers of the material wherein depositing the one or more layers of the material comprises: depositing one or more layers of a $HfO_2$—$TiO_2$-based material.

* * * * *